US010410862B2

(12) United States Patent
Terterian et al.

(10) Patent No.: US 10,410,862 B2
(45) Date of Patent: Sep. 10, 2019

(54) 3D TCAD SIMULATION

(71) Applicant: SYNOPSYS, INC., Mountain View, CA (US)

(72) Inventors: Arsen Terterian, Zurich-Oerlikon (CH); Tommaso Cilento, Zurich-Oerlikon (CH)

(73) Assignee: SYNOPSYS, INC., Mountain View, CA (US)

( * ) Notice: Subject to any disclaimer, the term of this patent is extended or adjusted under 35 U.S.C. 154(b) by 533 days.

(21) Appl. No.: 14/699,162

(22) Filed: Apr. 29, 2015

(65) Prior Publication Data

US 2015/0317420 A1 Nov. 5, 2015

Related U.S. Application Data

(60) Provisional application No. 62/016,943, filed on Jun. 25, 2014, provisional application No. 62/011,724, (Continued)

(51) Int. Cl.
*G06F 17/50* (2006.01)
*H01L 21/027* (2006.01)

(52) U.S. Cl.
CPC ........ *H01L 21/027* (2013.01); *G06F 17/5009* (2013.01); *G06F 17/5036* (2013.01)

(58) Field of Classification Search
CPC . G06F 17/5022; G06F 17/5036; H01L 21/027
See application file for complete search history.

(56) References Cited

U.S. PATENT DOCUMENTS

| 4,536,945 A * | 8/1985 | Gray ................. H01L 21/28537 |
| | | 257/378 |
| 5,245,543 A | 9/1993 | Smayling et al. |

(Continued)

FOREIGN PATENT DOCUMENTS

| JP | H06290240 A | 10/1994 |
| JP | 2002270478 A | 9/2002 |

(Continued)

OTHER PUBLICATIONS

Furukawa, Seijiro, Hideki Matsumura, and Hiroshi Ishiwara. "Theoretical considerations on lateral spread of implanted ions." Japanese Journal of Applied Physics 11.2 (1972): 134.*

(Continued)

*Primary Examiner* — Omar F Fernandez Rivas
*Assistant Examiner* — Joshua E. Jensen
(74) *Attorney, Agent, or Firm* — Haynes Beffel & Wolfeld LLP

(57) ABSTRACT

A first representation of an integrated circuit undergoing processing is transformed into a second representation. The second representation including additional dopants relative to the first representation. The transformation generates a three-dimensional dopant distribution from adding a first dopant under a first set of process conditions with a mask, by combining the two-dimensional lateral profile of the dopant with the one-dimensional depth profile of the dopant. The one-dimensional depth profile of the dopant is retrieved from a database storing selected results from earlier process simulation of the first addition of the first dopant under the first set of process conditions. The two-dimensional lateral dopant profile from adding the first dopant under the first set of process conditions with a first mask corresponding to the first dopant, is generated by convolving the mask with a (Continued)

lateral diffusion function, or from at least one solution to the 2D diffusion equation without convolution.

35 Claims, 19 Drawing Sheets

Related U.S. Application Data filed on Jun. 13, 2014, provisional application No. 61/987,766, filed on May 2, 2014.

(56) References Cited

U.S. PATENT DOCUMENTS

| | | | |
|---|---|---|---|
| 5,889,678 A | 3/1999 | Inoue et al. | |
| 6,645,854 B1 | 11/2003 | Hopper | |
| 7,846,822 B2 | 12/2010 | Seebauer et al. | |
| 8,664,699 B2 | 3/2014 | Nuzzo et al. | |
| 2005/0145930 A1* | 7/2005 | Edwards | H01L 27/088 257/327 |
| 2012/0276723 A1 | 11/2012 | Komachi | |
| 2013/0194577 A1 | 8/2013 | Bogdanowicz | |
| 2013/0313620 A1 | 11/2013 | Morris | |

FOREIGN PATENT DOCUMENTS

| | | |
|---|---|---|
| JP | 2005217230 A | 8/2005 |
| JP | 2007019173 A | 1/2007 |
| JP | 2012209536 A | 10/2012 |
| TW | I284423 B | 7/2007 |
| TW | 200836353 A | 9/2008 |

OTHER PUBLICATIONS

Ryssel, H., L. Gong, and J. Lorenz. "Improvements in simulation of 2D implantation profiles." VLSI Technology, Systems and Applications, 1989. Proceedings of Technical Papers. 1989 International Symposium on. IEEE, 1989.*

Antoniadis, Dimitri A., and Robert W. Dutton. "Models for computer simulation of complete IC fabrication process." IEEE Journal of Solid-State Circuits 14.2 (1979): 412-422.*

Nakagawa, S. T. "The high-fluence effect on the lateral spread of ions within a masked target." Materials chemistry and physics 54.1-3 (1998): 28-32.*

Furukawa, Seijiro, Hideki Matsumura, and Hiroshi Ishiwara. "Theoretical considerations on lateral spread of implanted ions." Japanese Journal of Applied Physics 11.2 (1972): 134. (Year: 1972).*

Ryssel, H., L. Gong, and J. Lorenz. "Improvements in simulation of 2D implantation profiles." VLSI Technology, Systems and Applications, 1989. Proceedings of Technical Papers. 1989 International Symposium on. IEEE, 1989. (Year: 1989).*

Antoniadis, Dimitri A., and Robert W. Dutton. "Models for computer simulation of complete IC fabrication process." IEEE Journal of Solid-State Circuits 14.2 (1979): 412-422. (Year: 1979).*

Nakagawa, S. T. "The high-fluence effect on the lateral spread of ions within a masked target." Materials chemistry and physics 54.1-3 (1998): 28-32. (Year: 1998).*

Thompson, Keith, et al. "Three-dimensional atom mapping of dopants in Si nanostructures." Applied Physics Letters 87.5 (2005): 052108. (Year: 2005).*

Vandervorst, Wilfried, et al. "Dopant/carrier profiling for 3D-structures." physica status solidi (c) 11.1 (2014): 121-129. (Year: 2014).*

Fichtner, W., and P. Regli. "Multi-dimensional process simulation software integration in Prompt." Solid State Device Research Conference, 1996. ESSDERC'96. Proceedings of the 26th European. IEEE, 1996. (Year: 1996).*

TW Office Action from counterpart Application No. TW104113718 dated Jul. 25, 2016, 16 pages.

PCT/US2015/028276—International Preliminary Report on Patentability dated Nov. 8, 2016, 9 pages.

International Search Report dated Jul. 28, 2015 for PCT Application No. PCT/US2015/028276.

Fichtner et al., "Multi-Dimensional Process Simulation Software Integration in Prompt", ISL, Swiss Federal Inst. of Technology and ISE Integrated Systems Engineering AG, Zurich, Switzerland, Solid State Device Research Conference, 1996, Proceedings of the 26th European, IEEE, Piscataway, NJ, USA, Sep. 9, 1996, ISBN: 978-2-86332-196-6, pp. 335-342.

Godfrey, "Modelling Physical Processes in Silicon Integrated Circuit Fabrication", Physics in Technology, Institute of Physics Publishing, Bristol, GB, vol. 17, No. 6, Nov. 1, 1976, pp. 260-264, XP020048051, ISSN: 0305-4624.

Bar et al, "Experimental Verification of Three-Dimensional Simulations of LTO Layer Deposition on Structures Prepared by Anisotropic Wet Etching of Silicon", Microelectronics & Reliability, Elsevier Science LTD, GB, vol. 38, No. 2, Feb. 27, 1998, pp. 287-291, XPO27119448, ISSN: 0026-2714.

Thompson et al. "Three-dimensional atom mapping of dopants in Si nanostructures," Applied Physics Letters 87.5 (2005):052108, 3 pages.

JP 2017-509604—Notice of Allowance dated Aug. 7, 2018, 7 pages.

EP 15785526-3—Response to Extended European Search Report dated Jan. 4, 2018 filed Aug. 2, 2018, 12 pages.

EP 15785526-3—Extended European Search Report dated Jan. 4, 2018.

JP 2017-509604—First Office Action dated Feb. 6, 2018, 9 pages.

Senez et al., "3-Dimensional Process Simulation of Thermal Annealing of Low Dose Implanted Dopants in Silicon", IEICE Trans Electron, vol. E83-C, No. 8, Aug. 2000, pp. 1267-1274.

Colombeau et al., "Design and Optimization of nanoCMOS devices using predictive atomistic physics-based process modeling", 2006 International Electron Devices Meeting, IEEE Conferences, pp. 1-4, Chartered Semiconductor Ltd, Singapore 738406, Department of Electronics, University of Valladolid, 47011, Spain, Advanced Technology Institute, University of Surrey, UK.

JP 2017-509604—Response to First Office Action dated Feb. 6, 2018 filed Jul. 23, 2018, 9 pages.

* cited by examiner

Before diffusion, boron concentration is 10^16cm⁻³ in oxide, and zero in silicon.

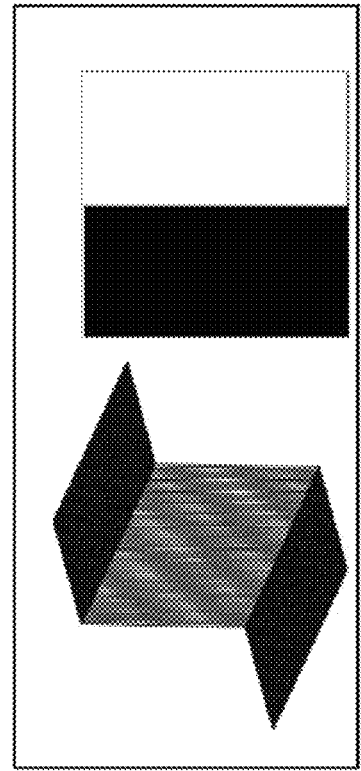
FIG. 15a
sharp mask image
$$f(x) = \frac{1}{\sigma\sqrt{2\pi}} e^{-\frac{x^2}{2\sigma^2}}$$
$$\sigma = \frac{DL}{\sqrt{2}}$$
Gaussian function
FIG. 15b
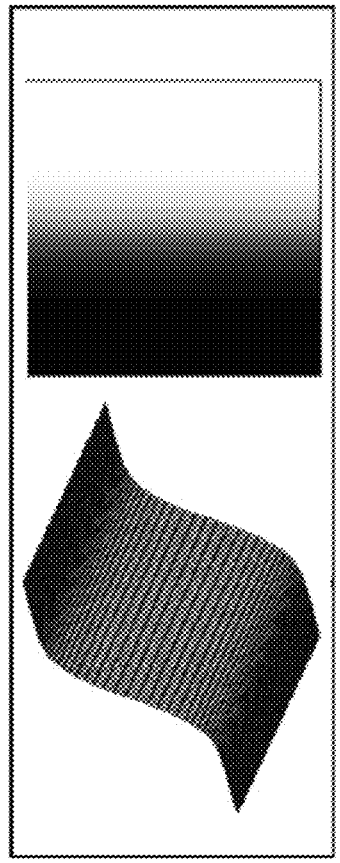
Gaussian blur (convolution)
FIG. 15c

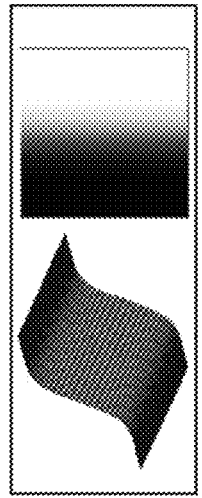
sharp mask image
(initial condition for diffusion)
FIG. 17a
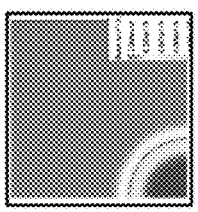
Diffusion
$$\frac{\partial C}{\partial t} = D \frac{\partial^2 C}{\partial x^2}$$
FIG. 17b
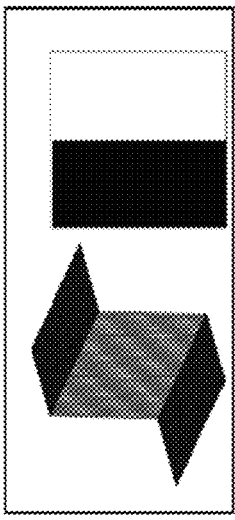
Gaussian blur
(w/diffusion)
FIG. 17c
$$\Phi(x) = \frac{C_{max}}{2}\left[1 + erf\left(\frac{x}{2\sqrt{D\tau}}\right)\right]$$
FIG. 17d
$$DL = 2\sqrt{D\tau} \Rightarrow D = \frac{DL}{4}, \tau = 1s$$
FIG. 17e

3D TCAD SIMULATION

RELATED APPLICATIONS

This application claims the benefit of U.S. Provisional Application No. 62/016,943 filed 25 Jun. 2014, U.S. Provisional Application No. 62/011,724 filed 13 Jun. 2014, and U.S. Provisional Application No. 61/987,766 filed 2 May 2014. All applications are incorporated by reference.

BACKGROUND

Embodiments of the invention relate to methods and systems for improving the transformation between representations of integrated circuits. Embodiments of the invention also relate to methods and systems for improving the modeling of integrated circuits.

SUMMARY

One aspect of the technology is a non-transitory computer readable medium having stored thereon a plurality of instructions, which when executed by a processor, transforms a first representation of an integrated circuit undergoing processing into a second representation of the integrated circuit undergoing processing, the second representation of the integrated circuit undergoing processing including additional dopants relative to the first representation of the integrated circuit undergoing processing, comprising the instructions that perform:

performing process simulation of a first addition of a first dopant under a first set of process conditions to generate a one-dimensional lateral profile of the first dopant and a one-dimensional depth profile of the first dopant;

generating a two-dimensional lateral dopant profile from adding the first dopant under the first set of process conditions with a first mask corresponding to the first dopant, by convolving the first mask with a lateral diffusion function in two dimensions, the lateral diffusion function customized with spreading data from the one-dimensional lateral profile; and generating a three-dimensional dopant distribution from adding the first dopant under the first set of process conditions with the mask, by combining the two-dimensional lateral profile of the dopant with the one-dimensional depth profile of the dopant.

In one embodiment, the process simulation is performed with another mask different from the first mask.

In one embodiment, the three-dimensional dopant distribution conserves a quantity of the first dopant.

In one embodiment, the first set of conditions are end-of-process conditions that incorporate other thermal processes subsequent to the first addition of the first dopant, the other thermal processes associated with at least one of another addition of the first dopant and an addition of another dopant.

In one embodiment, the spreading data is a parameter generated by fitting the one-dimensional lateral profile to at least an error function erf.

In one embodiment, the one-dimensional lateral profile is selected from results of the process simulation at a surface depth.

In one embodiment, the two-dimensional lateral dopant profile differs for field oxidation and hard mask oxidation, and the one-dimensional depth profile differs for field oxidation and hard mask oxidation.

In one embodiment, the lateral diffusion function is a Gaussian.

In one embodiment, the spreading data is a standard deviation.

In one embodiment, the three-dimensional dopant distribution generated with the mask being non-rectangular, has results within about 10% of a complete 3D simulation.

In one embodiment, the three-dimensional dopant distribution generated with the mask having an opening dimension of about 1-4 microns, has results within about 10% of a complete 3D simulation.

In one embodiment, the data processor is further configured to:

split the first mask into a second mask and a third mask, the second mask overlapping with an oxidation mask such as a LOCOS mask, and the third mask not overlapping with the oxidation mask such as the LOCOS mask, and separate convolutions with different lateral diffusion functions are performed with the second mask and the third mask.

One aspect of the technology is a non-transitory computer readable medium having stored thereon a plurality of instructions, which when executed by a processor, transforms a first representation of an integrated circuit undergoing processing into a second representation of the integrated circuit undergoing processing, the second representation of the integrated circuit undergoing processing including additional dopants relative to the first representation of the integrated circuit undergoing processing, comprising the instructions that perform:

performing process simulation of a first addition of a first dopant under a first set of process conditions to generate a one-dimensional lateral profile of the first dopant and a one-dimensional depth profile of the first dopant;

generating a two-dimensional lateral dopant profile from adding the first dopant under the first set of process conditions with a first mask corresponding to the first dopant, using at least a diffusion equation, the diffusion equation customized with diffusion length data from the one-dimensional lateral profile; and generating a three-dimensional dopant distribution from adding the first dopant under the first set of process conditions with the mask, by combining the two-dimensional lateral profile of the dopant with the one-dimensional depth profile of the dopant.

One aspect of the technology is a non-transitory computer readable medium having stored thereon a plurality of instructions, which when executed by a processor, transforms a first representation of an integrated circuit undergoing processing into a second representation of the integrated circuit undergoing processing, the second representation of the integrated circuit undergoing processing including additional dopants relative to the first representation of the integrated circuit undergoing processing, comprising the instructions that perform:

accessing a one-dimensional lateral profile of a first dopant and a one-dimensional depth profile of the first dopant, the one-dimensional lateral profile representative of a first addition of the first dopant under a first set of process conditions;

accessing a two-dimensional lateral dopant profile of the first dopant, the two-dimensional lateral dopant profile representative of adding the first dopant under the first set of process conditions with a first mask corresponding to the first dopant, wherein two-dimensional lateral dopant profile is a result of convolving the first mask with a lateral diffusion function in two dimensions, the lateral diffusion function customized with spreading data from the one-dimensional lateral profile; and generating a three-dimensional dopant distribution from adding the first dopant under the first set of process conditions with the mask, by combining the two-dimensional lateral profile of the dopant with the one-dimensional depth profile of the dopant.

Another aspect of the invention is a system for simulating integrated circuit processing, comprising a memory and a data processor coupled to the memory. The data processor is configured to transform a first representation of an integrated circuit undergoing processing into a second representation of the integrated circuit undergoing processing. The second representation of the integrated circuit undergoing processing includes additional dopants relative to the first representation of the integrated circuit undergoing processing. The data processor performs steps as described herein.

Another aspect of the technology method for simulating integrated circuit processing as described herein.

BRIEF DESCRIPTION OF THE DRAWINGS

FIGS. 15a-c show one embodiment of generating a 2D lateral profile by convolving a mask image with a Gaussian.

FIGS. 17a-e show one embodiment of generating a 2D lateral profile by using a solution of a diffusion equation with the mask as an initial condition.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
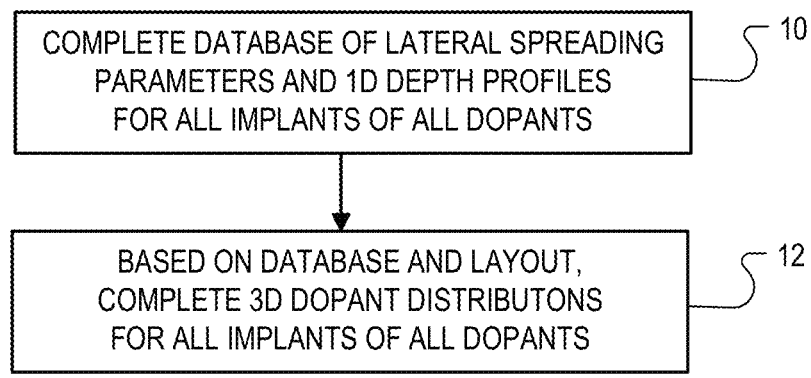
FIG. 1 is a simplified process flow of the improved simulation of a 3D fabrication process.

FIG. 1 is a simplified process flow of the improved simulation of a 3D fabrication process.

Broadly, the process flow is divided into the steps of building a database of process information step 10, and completing a 3D dopant distribution based on the database step 12. In more detail, in step 10 the database includes lateral spreading parameters and 1D depth profiles for all implants of all dopants. In more detail, in step 12 the 3D dopant distributions are built based on the database and the masks of the layout. Step 10 is shown in more steps in FIG. 2. Step 12 is shown in more steps in FIG. 6.

Figure 2:
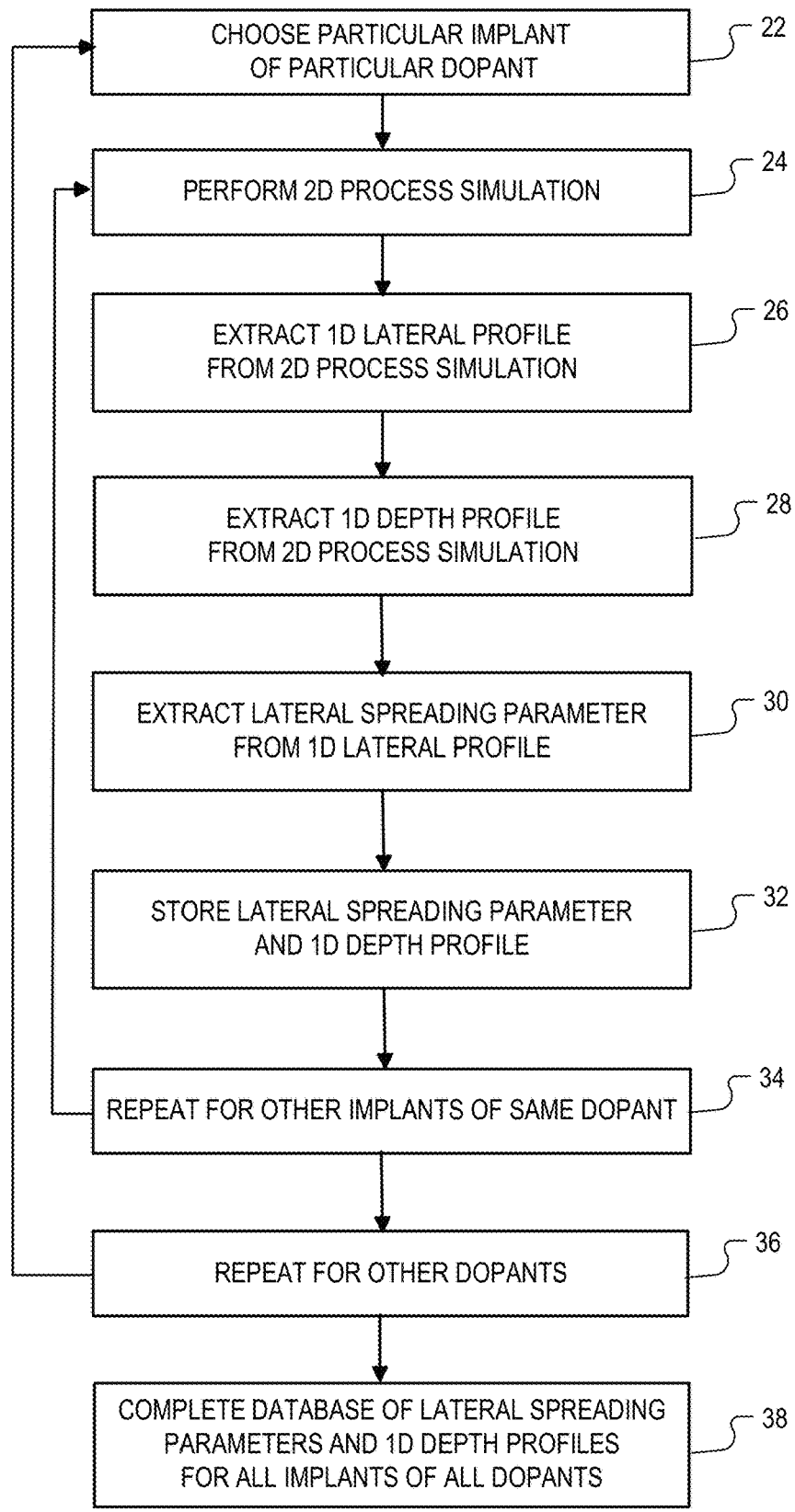
FIG. 2 is a simplified process flow showing more detail on the step of completing a database in FIG. 1.

FIG. 2 is a simplified process flow showing more detail on the step of completing a database in FIG. 1.

In 22, a particular implant of a particular dopant is chosen. The implants can be elements on the periodic table or compounds thereof. Alternatively, this step can be the choice of a particular oxidation step.

In 24, 2D process simulation is performed for the particular implant of the particular dopant. Alternatively, the 2D process simulation is performed for the particular oxidation. Step 24 is shown in more detail in FIG. 3. In another embodiment, a 3D process simulation is performed, and a 2D vertical slice is extracted, which is another way to perform 2D process simulation, though more computationally expensive.

Figure 4:
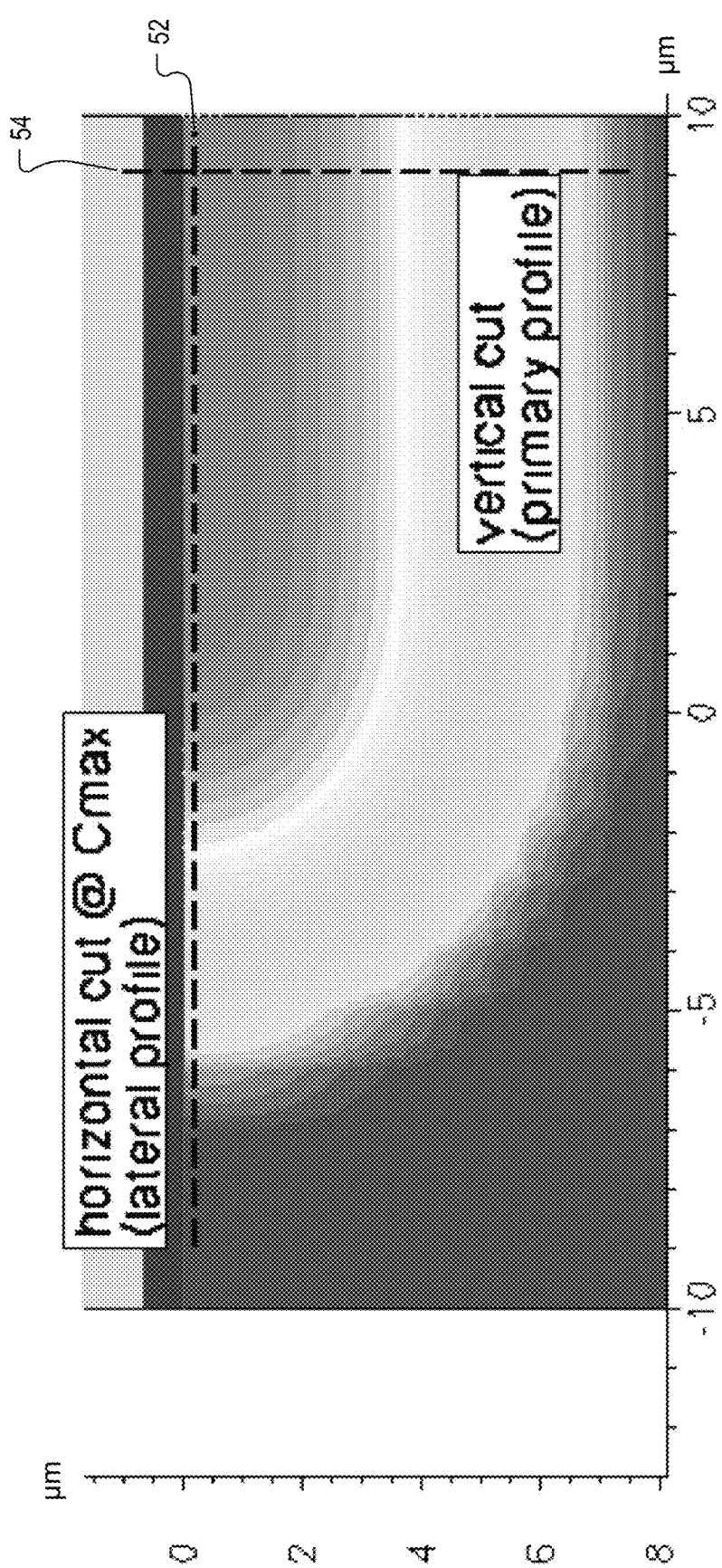
FIG. 4 shows a vertical 2D process simulation, and an example of generating test 1D lateral and 1D depth profiles.

In 26, a 1D lateral profile is extracted from the 2D process simulation. In 28, a 1D depth profile is extracted from the 2D process simulation. An example is shown at FIG. 4. In one embodiment, the 2D process simulation can be separate simulations such that 1D lateral profile and the 1D depth profile are extracted from different 2D process simulations. However, the embodiment of extracting the 1D lateral profile and the 1D depth profile from the same 2D process simulation requires fewer processing resources. Either embodiment is an example of performing process simulation to generate a 1D lateral profile of a dopant and a 1D depth profile of the first dopant.

Figure 5:
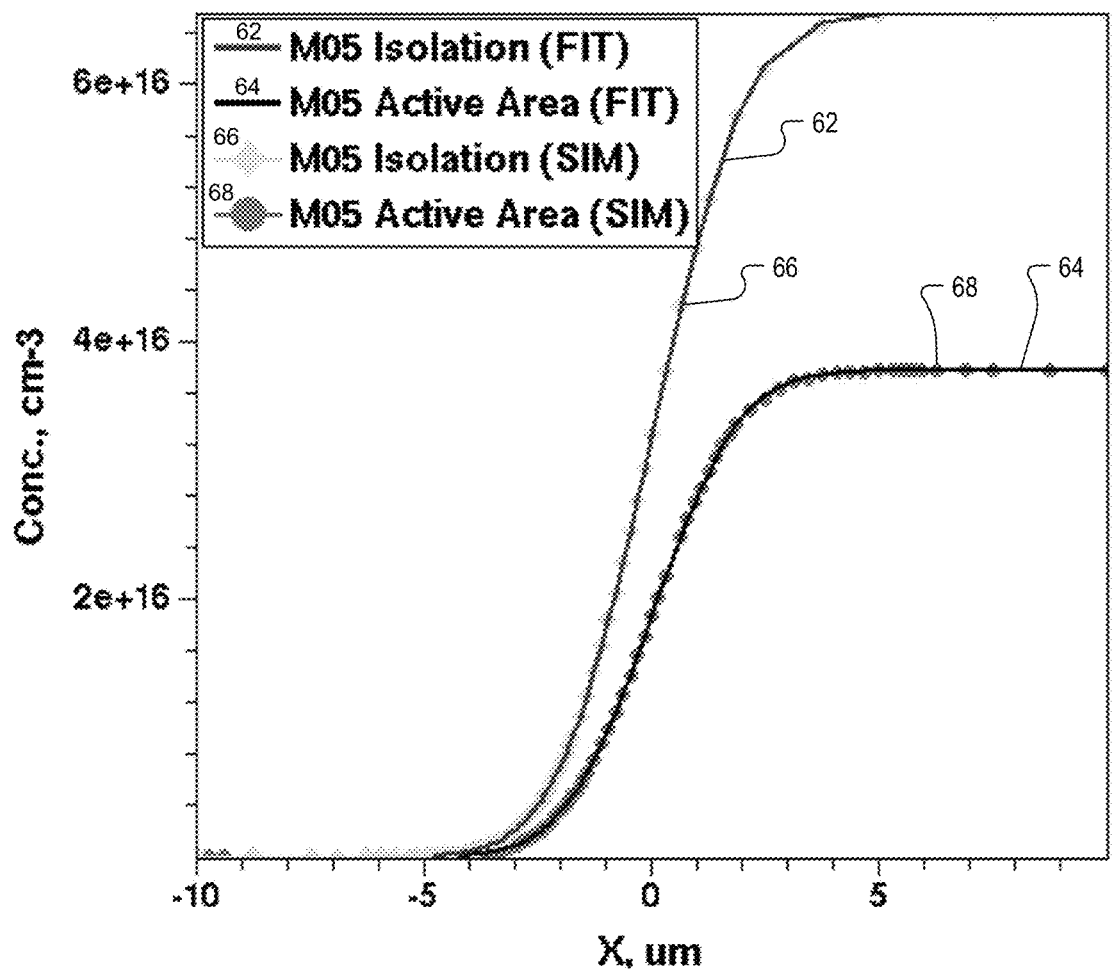
FIG. 5 shows examples of extracting lateral spreading parameter from test 1D lateral profiles.

In 30, a lateral spreading parameter is extracted from the 1D lateral profile. An example is shown in FIG. 5.

In 32, the lateral spreading profile and the 1D depth profile are stored in one or more databases. In another embodiment, the 1D lateral profile is stored instead of, or in addition to, the lateral spreading parameter. If the 1D lateral profile is stored, extraction of the lateral spreading parameter can be delayed until a later step, no later than when the lateral spreading parameter is needed.

In 34, the process flow loops back for other implants of the same dopant.

In 36, the process flow loops back for other dopants.

In another embodiment, the process at least partly interleaves, and/or performs at least partly concurrently, calculations for different implants of the same dopant or different dopants.

In 38, the database is completed of lateral spreading parameters and 1D depth profiles for all implants of all dopants, and all oxidations. In yet another embodiment, the database stores the 2D process simulations, and extracts the lateral and vertical profiles and the lateral spreading parameter later.

Various embodiments can reorder, add, remove, or change steps in the process flow.

Figure 3:
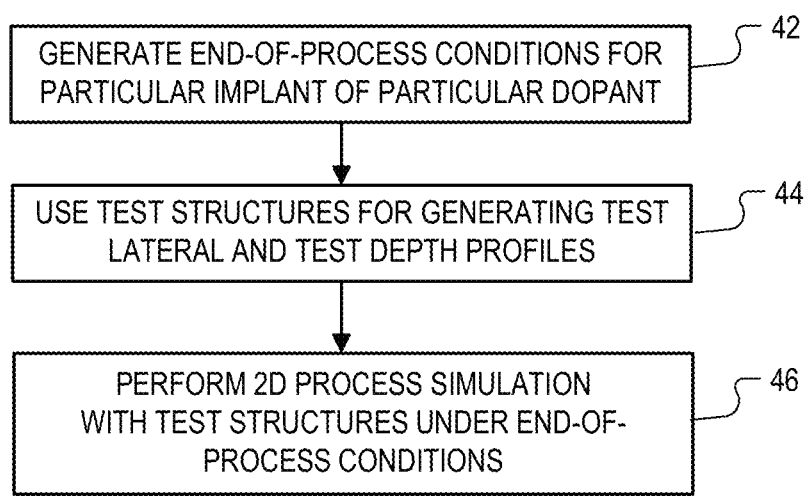
FIG. 3 is a simplified process flow showing more detail on the step of performing 2D process simulation in FIG. 1.

FIG. 3 is a simplified process flow showing more detail on the step of performing 2D process simulation in FIG. 1.

In 42, end-of-process conditions are generated for a particular implant of a particular dopant. Alternatively, end-of-process conditions are generated for a particular oxidation step. The end-of-process conditions consider not only temperatures and durations of thermal processes immediately after the particular implant of the particular dopant, but also temperatures and durations of subsequent thermal processes.

In 44, test structures are used for generating the test lateral and test depth profiles. In one example, the test structures are based on basic polygonal shapes such as rectangular masks. The rectangular opening of the mask results in sufficient data to extract test lateral and test depth profiles. Other embodiments have different sized or shaped mask openings. Beyond the extracted test lateral and test depth profiles, the remainder of the 2D simulation results are discarded. Although more complicated masks may be used also, such complicated masks require more complicated 2D simulation that is unnecessary for the purpose of extracting the test lateral and test depth profiles.

Different masks are used in different stages of the overall simulation. Step 44 uses a first mask to generate basic data. An end result of this overall technology is a simulation of a 2D doping distribution from adding a dopant through a second mask, taking advantage of the basic data gained with the first mask. The first and second masks are different.

In 46, 2D simulation is performed with test structures from 44 under end-of-process conditions from 42.

FIG. 4 shows a vertical 2D process simulation, and an example of generating test 1D lateral and 1D depth profiles.

Shown are an example test 1D lateral profile 52 and an example test 1D depth profile. The purpose of this 2D process simulation was to generate the test 1D lateral and test 1D depth profiles for a particular implant of a particular dopant. Accordingly, the remainder of the results of this 2D process simulation can be discarded.

The example test 1D lateral profile 52 is taken along the surface of the substrate. The example test 1D depth profile can be taken generally from about the middle of the mask opening. The figure of the 2D slice does not show the right portion of the mask opening, which during simulation can be omitted to take advantage of symmetry for faster simulation results.

FIG. 5 shows examples of extracting lateral spreading parameter from test 1D lateral profiles.

The graph includes lateral profiles 66 and 68 extracted from respective 2D process simulations. In one embodiment, lateral spreading parameters are extracted from lateral profiles 66 and 68 by curve fitting an error function erf of the following form, with another scaling constant (not shown) for the maximum concentration:

$$\text{erf}(x) = \frac{2}{\sqrt{\pi}} \int_0^x e^{\frac{-x^2}{2\sigma^2}}$$

A respective lateral spreading parameter, in this case the standard deviation, is extracted after performing a curve fit between erf(x) with various candidate standard deviations.

The curve fit of 62 to 66 generates a lateral spreading parameter for the lateral profile 66. The curve fit of 64 to 68 generates a lateral spreading parameter for the lateral profile 68. A single quantity, the lateral spreading parameter a, characterizes an entire curve.

Figure 6:
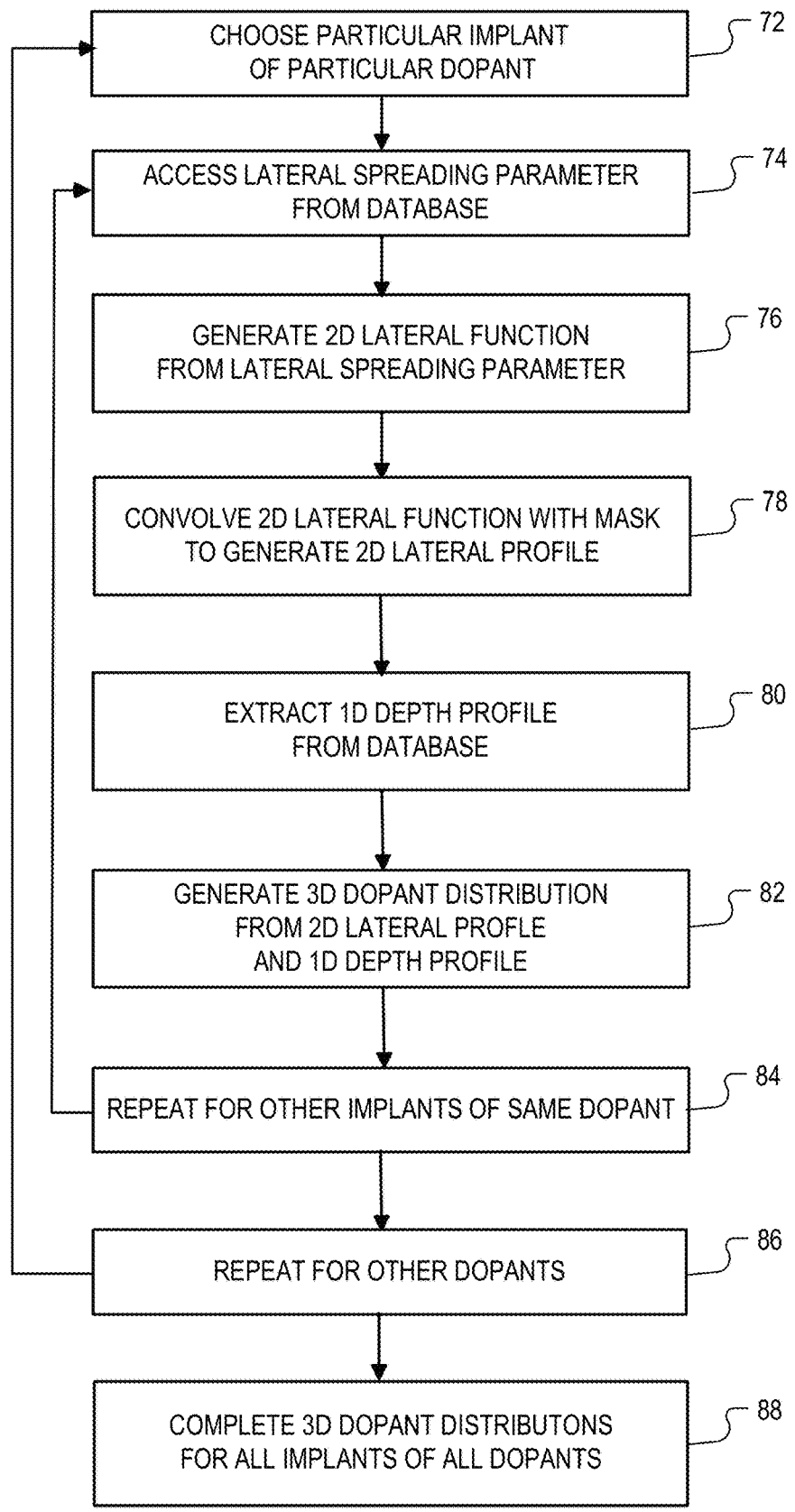
FIG. 6 is a simplified process flow showing more detail on the step of completing 3D dopant distributions in FIG. 1.

FIG. 6 is a simplified process flow showing more detail on the step of completing 3D dopant distributions in FIG. 1.

In 72, a particular implant of a particular dopant is chosen. These are the same set of dopants and the same set of implants as with step 22 of FIG. 2. Alternatively, a particular oxidation is chosen as with step 22 of FIG. 2.

In 74, the lateral spreading parameter is accessed from the database. The lateral spreading parameter was stored in the database in 32 of FIG. 2.

In 76, a 2D lateral function is generated from the lateral spreading profile. In one embodiment, the lateral spreading parameter (for example, a standard deviation) which was extracted in 30 of FIG. 2, is used in a Gaussian function of the following form, with another scaling constant (not shown):

$$G(x, y) = \frac{1}{2\pi\sigma^2} e^{\frac{-(x^2+y^2)}{2\sigma^2}}$$

In 78, the 2D lateral function is convolved with the mask for the particular implant of the particular dopant, to generate the 2D lateral profile. Alternatively, the 2D lateral function is convolved with the mask for the particular oxidation, to generate the 2D lateral profile.

Alternatively, the 2D lateral profile is obtained via another type of analytic implantation with the Gaussian function. However, analytic implantation generally requires a 3D mesh which is computationally expensive.

In 80, the 1D depth profile is extracted from the database. The 1D depth profile was stored in the database in 32 of FIG. 2.

In 82, the 3D dopant distribution is generated from the 2D lateral profile and the 1D depth profile.

In 84, the process flow loops back for other implants of the same dopant.

In 86, the process flow loops back for other dopants.

In another embodiment, the process at least partly interleaves, and/or performs at least partly concurrently, calculations for different implants of the same dopant or different dopants.

In 88, the 3D dopant distributions are completed for all implants of all dopants, and all oxidations.

Various embodiments can reorder, add, remove, or change steps in the process flow.

In some embodiments, implants behave differently under an oxidation such as LOCOS and active area. Accordingly, a given implant may be split into two masks: a first mask of the implant that overlaps with the oxidation such as LOCOS, and a second mask of the remainder.

In one example, the software representations of an isolation mask and an implantation mask are processed to obtain the software representation of the intersection of the isolation mask and the implantation mask. A Boolean AND operation or "*" yields the intersection, such as intersection area=isolation mask*implantation mask. This intersection area indicates where as-implanted ions hit isolation oxide such as STI or LOCOS. Subtraction of the isolation mask from the implantation mask indicates the active area of the device exposed to the ion beam, for example active area=implantation mask−isolation mask. The intersection area and active area are treated with different 1D depth profiles and resulting 3D dopant distributions, despite representing the same dopant.

More generally, such Boolean manipulation of masks can take into account the shielding properties of materials that block implants. Another example is to take into account the shielding properties of gates such as polysilicon gates, for example by subtracting the gate area from the intersection area and the active area for an LDD implant. Another example is to take into account the shielding properties of spacers such as nitride spacers (such as when spacers extend the gate mask), for example by subtracting the spacer area from the intersection area and the active area.

In another embodiment, a device with a slightly different dose, such as an NWELL dose, such as up to +/−10% can be simulated in different ways: rescale the old dose data without having to perform more process simulation, or perform more process simulation with the changed implantation dose.

In another embodiment, the simulation generates a 2D profile. To generate the 2D dopant distribution, the 1D depth profile is multiplied with a 1D lateral profile. The 1D lateral profile is generated by convolving the 1D slice of the mask with a 1D Gaussian function. The 2D dopant distribution corresponds to the region below the 1D slice of the mask.

The 1D Gaussian function has the following form, with another scaling constant (not shown):

$$G(x, y) = \frac{1}{\sigma\sqrt{2\pi}} e^{\frac{-x^2}{2\sigma^2}}$$

Figure 7:
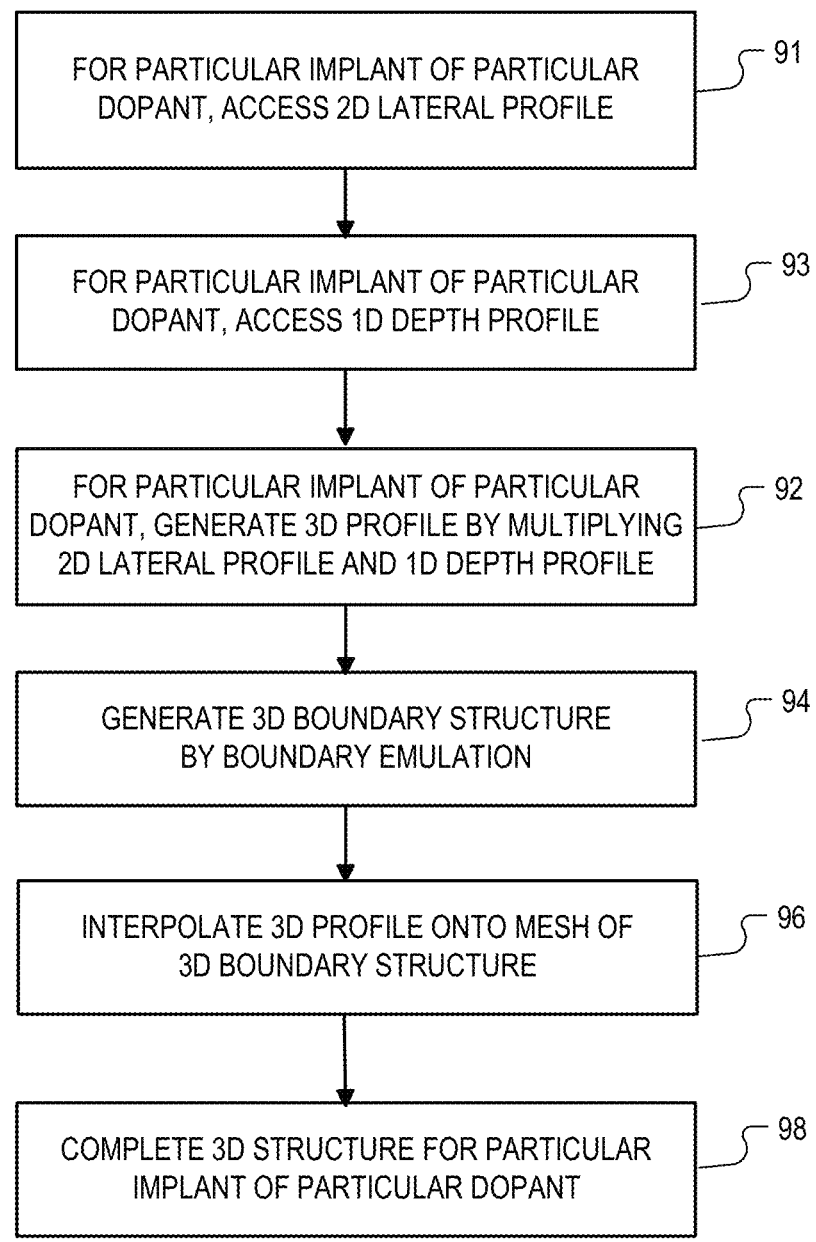
FIG. 7 is a simplified process flow showing more detail on the step of generating 3D dopant distributions in FIG. 6.

FIG. 7 is a simplified process flow showing more detail on the step of generating 3D dopant distributions in FIG. 6.

In 92, for a particular implant of a particular dopant, a 3D profile is generated by multiplying the 2D lateral profile and the 1D depth profile.

In 94, a 3D boundary structure is generated by boundary emulation.

In 96, the 3D profile is interpolated onto the mesh of the 3D boundary structure.

In 98, the 3D structure is completed for the particular implant of the particular dopant. Alternatively, the 3D structure is completed for the particular oxidation.

Computer System

Figure 8:
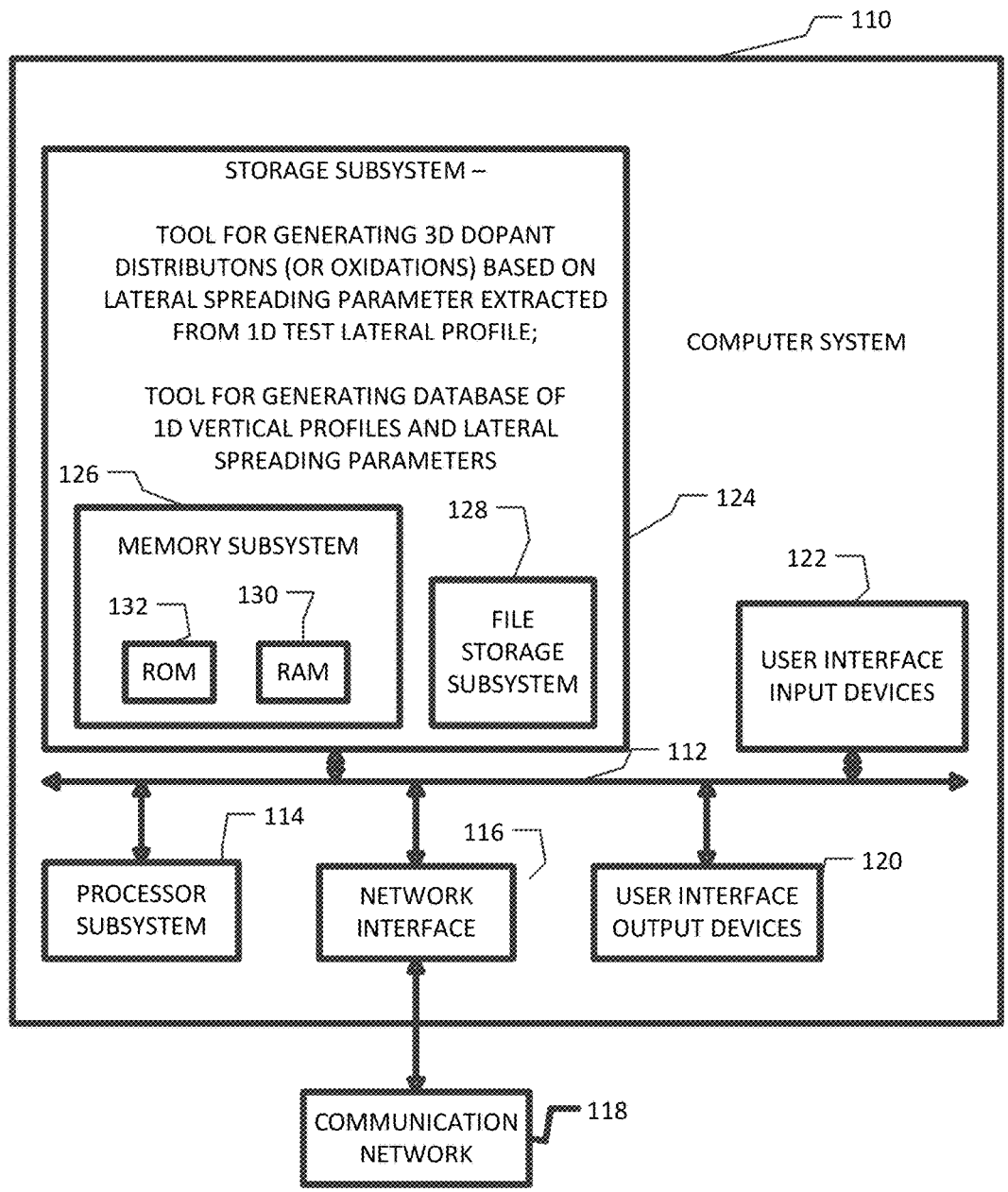
FIG. 8 is a simplified block diagram of a computer system that can be used to implement aspects of the invention.

FIG. 8 is a simplified block diagram of a computer system 110 that can be used to implement software incorporating aspects of the present invention. While the present paper indicates individual steps carrying out specified operations, it will be appreciated that each step is actually implemented with software instructions that cause the computer system 110 to operate in the specified manner. The group of software instructions and data to implement a particular step, in conjunction with the processing subsystem and other components of the computer system which enable such software instructions to be executed, constitute a module which implements the particular step.

Computer system 110 typically includes a processor subsystem 114 which communicates with a number of peripheral devices via bus subsystem 112. These peripheral devices may include a storage subsystem 124, comprising a memory subsystem 126 and a file storage subsystem 128, user interface input devices 122, user interface output devices 120, and a network interface subsystem 116. The input and output devices allow user interaction with computer system 110. Network interface subsystem 116 provides an interface to outside networks, including an interface to communication network 118, and is coupled via communication network 118 to corresponding interface devices in other computer systems. Communication network 118 may comprise many interconnected computer systems and communication links. These communication links may be wireline links, optical links, wireless links, or any other mechanisms for communication of information. While in one embodiment, communication network 118 is the Internet, in other embodiments, communication network 118 may be any suitable computer network.

The physical hardware component of network interfaces are sometimes referred to as network interface cards (NICs), although they need not be in the form of cards: for instance they could be in the form of integrated circuits (ICs) and connectors fitted directly onto a motherboard, or in the form of macrocells fabricated on a single integrated circuit chip with other components of the computer system.

User interface input devices 122 may include a keyboard, pointing devices such as a mouse, trackball, touchpad, or graphics tablet, a scanner, a touch screen incorporated into the display, audio input devices such as voice recognition systems, microphones, and other types of input devices. In general, use of the term "input device" is intended to include all possible types of devices and ways to input information into computer system 110 or onto computer network 118.

User interface output devices 120 may include a display subsystem, a printer, a fax machine, or nonvisual displays such as audio output devices. The display subsystem may include a cathode ray tube (CRT), a flat panel device such as a liquid crystal display (LCD), a projection device, or some other mechanism for creating a visible image. The display subsystem may also provide non visual display such as via audio output devices. In general, use of the term "output device" is intended to include all possible types of devices and ways to output information from computer system 110 to the user or to another machine or computer system.

Storage subsystem 124 stores the basic programming and data constructs that provide the functionality of certain embodiments of the present invention. For example, the various modules implementing the functionality of certain embodiments of the invention may be stored in storage subsystem 124. Some examples are a tool for generating 3D dopant distributions or 3D oxidations based on lateral spreading parameters extracted from 1D test lateral profiles; and a tool for generating a database of 1D vertical profiles and lateral spreading parameters. These software modules are generally executed by processor subsystem 114. Storage subsystem 124 also represents storage accessible to the computer system on which the various databases mentioned herein are stored. Storage subsystem 124 can store the database of 1D vertical profiles and lateral spreading profiles; and a tool for generating a database of 1D vertical profiles and lateral spreading parameters. Alternatively, the tool accesses the local or remote database of 1D vertical profiles and lateral spreading parameters, or in combination both generates and accesses the database. In another embodiment some or all of the databases are located on storage accessible to the computer system via the network 118.

Memory subsystem 126 typically includes a number of memories including a main random access memory (RAM) 130 for storage of instructions and data during program execution and a read only memory (ROM) 132 in which fixed instructions are stored. File storage subsystem 128 provides persistent storage for program and data files, and may include a hard disk drive, a floppy disk drive along with associated removable media, a CD ROM drive, an optical drive, or removable media cartridges. The databases and modules implementing the functionality of certain embodiments of the invention may have been provided on a computer readable medium such as one or more CD-ROMs, and may be stored by file storage subsystem 128. The host memory 126 contains, among other things, computer instructions which, when executed by the processor subsystem 114, cause the computer system to operate or perform functions as described herein. As used herein, processes and software that are said to run in or on "the host" or "the computer", execute on the processor subsystem 114 in response to computer instructions and data in the host memory subsystem 126 including any other local or remote storage for such instructions and data.

Bus subsystem 112 provides a mechanism for letting the various components and subsystems of computer system 110 communicate with each other as intended. Although bus subsystem 112 is shown schematically as a single bus, alternative embodiments of the bus subsystem may use multiple busses.

Computer system 110 itself can be of varying types including a personal computer, a portable computer, a workstation, a computer terminal, a network computer, a television, a mainframe, a server farm, or any other data processing system or user device. Due to the ever changing nature of computers and networks, the description of computer system 110 depicted in FIG. 8 is intended only as a specific example for purposes of illustrating certain embodiments of the present invention. Many other configurations of computer system 110 are possible having more or less components than the computer system depicted in FIG. 8.

Integrated Circuit Manufacturing Flow

Figure 9:
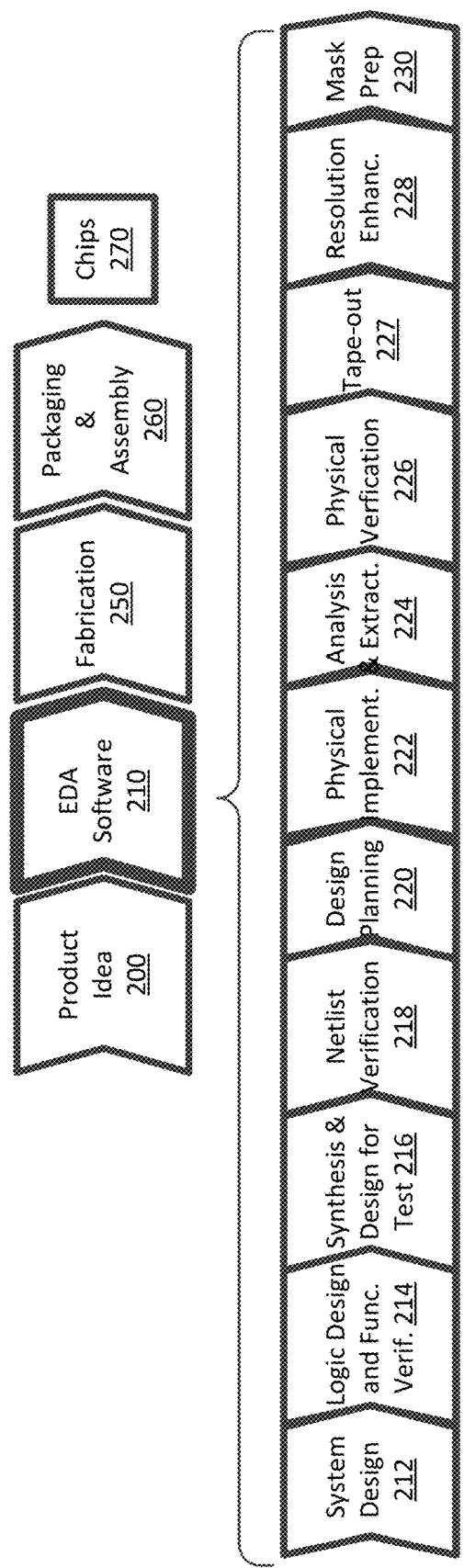
FIG. 9 is a simplified representation of an illustrative integrated circuit design flow.

FIG. 9 shows a simplified representation of an illustrative integrated circuit design flow incorporating features of the technology. At a high level, the process starts with the product idea (step 200) and is realized in an EDA (Electronic Design Automation) software design process (step 210). When the design is finalized, it can be taped-out (step 227). After tape out, the fabrication process (step 250) and packaging and assembly processes (step 260) occur resulting, ultimately, in finished integrated circuit chips (result 270).

The EDA software design process (step 210) is actually composed of a number of steps 212-230, shown in linear fashion for simplicity. In an actual integrated circuit design process, the particular design might have to go back through steps until certain tests are passed. Similarly, in any actual design process, these steps may occur in different orders and combinations. This description is therefore provided by way of context and general explanation rather than as a specific, or recommended, design flow for a particular integrated circuit.

A brief description of the components steps of the EDA software design process (step 210) will now be provided.

System design (step 212): The designers describe the functionality that they want to implement, they can perform what-if planning to refine functionality, check costs, etc. Hardware-software architecture partitioning can occur at this stage. Example EDA software products from Synopsys, Inc. that can be used at this step include Model Architect, Saber, System Studio, and DesignWare® products.

Logic design and functional verification (step 214): At this stage, the VHDL or Verilog code for modules in the system is written and the design is checked for functional accuracy. More specifically, the design is checked to ensure that produces the correct outputs in response to particular input stimuli. Example EDA software products from Synopsys, Inc. that can be used at this step include VCS, VERA, DesignWare®, Magellan, Formality, ESP and LEDA products.

Synthesis and design for test (step 216): Here, the VHDL/Verilog is translated to a netlist. The netlist can be optimized for the target technology. Additionally, the design and implementation of tests to permit checking of the finished chip occurs. Example EDA software products from Synopsys, Inc. that can be used at this step include Design Compiler®, Physical Compiler, Test Compiler, Power Compiler, FPGA Compiler, Tetramax, and DesignWare® products.

Netlist verification (step 218): At this step, the netlist is checked for compliance with timing constraints and for correspondence with the VHDL/Verilog source code. Example EDA software products from Synopsys, Inc. that can be used at this step include Formality, PrimeTime, and VCS products.

Design planning (step 220): Here, an overall floor plan for the chip is constructed and analyzed for timing and top-level routing. Example EDA software products from Synopsys, Inc. that can be used at this step include Astro and IC Compiler products.

Physical implementation (step 222): The placement (positioning of circuit elements) and routing (connection of the same) occurs at this step. Example EDA software products from Synopsys, Inc. that can be used at this step include the Astro and IC Compiler products.

Analysis and extraction (step 224): At this step, the circuit function is verified at a transistor level, this in turn permits what-if refinement. Example EDA software products from Synopsys, Inc. that can be used at this step include AstroRail, PrimeRail, Primetime, and Star RC/XT products.

Physical verification (step 226): At this step various checking functions are performed to ensure correctness for: manufacturing, electrical issues, lithographic issues, and circuitry. Example EDA software products from Synopsys, Inc. that can be used at this step include the Hercules product.

Tape-out (step 227): This step provides the "tape out" data for production of masks for lithographic use to produce finished chips. Example EDA software products from Synopsys, Inc. that can be used at this step include the CATS® family of products.

Resolution enhancement (step 228): This step involves geometric manipulations of the layout to improve manufacturability of the design. Example EDA software products from Synopsys, Inc. that can be used at this step include Proteus, ProteusAF, and PSMGen products.

Mask data preparation (step 230): This step provides the "tape-out" data for production of masks for lithographic use to produce finished chips. Example EDA software products from Synopsys, Inc. that can be used at this step include the CATS® family of products.

A typical integrated circuit manufacturing flow also includes a parallel flow, as follows:

(1) Develop individual process steps for manufacturing the integrated circuit. This can be modeled with the Synopsys tools "Sentaurus Process", "Sentaurus Topography", and "Sentaurus Lithography". The input information here include masks or layout information, and process conditions like temperature, reactor ambient, implant energy, etc. The output information is the final geometry or doping profiles or stress distribution. Aspects of the invention can be used in this step of the manufacturing flow.

(2) Integrate the individual process steps into the complete process flow. This can be modeled with the Synopsys tool "Sentaurus Process". The input information here includes the layout information and the collection of the process steps in the appropriate sequence. The output includes the geometry, the doping profiles, and the stress distribution for the transistors and the space in between the transistors. Aspects of the invention can be used also in this step of the manufacturing flow.

(3) Analyze performance of the transistor manufactured with this process flow. This can be done with the Synopsys tool "Sentaurus Device". The input information here includes the output of step (2) and the biases applied to transistor terminals. The output information includes the currents and capacitances for each bias combination.

(4) If necessary, modify the process steps and the process flow to achieve the desired transistor performance. This can be done iteratively by using the Synopsys tools mentioned above.

Once the process flow is ready, it can be used for manufacturing multiple circuit designs coming from various designers in various companies. The EDA flow 212-230 will be used by such designers. The parallel flow described here is used at a foundry to develop a process flow that can be used to manufacture designs coming from the designers. A combination of the process flow and the masks made from step 230 are used to manufacture any particular circuit. If the designers are at a different company, e.g. a fabless company, then usually it is the foundry that performs this parallel process flow whereas the process steps of FIG. 9 are performed typically by the fabless company. If the integrated circuit is manufactured at an IDM (integrated device manufacturer) company instead of the combination of a fabless company and a foundry, then both parallel flows described above are done at the same IDM company.

There is also a bridge between these tools and the 212-230 EDA tools. The bridge is a Synopsys tool "Seismos" that applies compact proximity models for particular circuit design and layout to obtain netlist with instance parameters for each individual transistor in the circuit as a function of its neighborhood and stress, including material conversion stress. This netlist is used in the analysis step 224.

The applicants hereby disclose in isolation each individual feature described herein and any combination of two or more such features, to the extent that such features or combinations are capable of being carried out based on the present specification as a whole in light of the common general knowledge of a person skilled in the art, irrespective of whether such features or combinations of features solve any problems disclosed herein, and without limitation to the scope of the claims. The applicants indicate that aspects of the present invention may consist of any such feature or combination of features. In view of the foregoing description it will be evident to a person skilled in the art that various modifications may be made within the scope of the invention.

Figure 10:
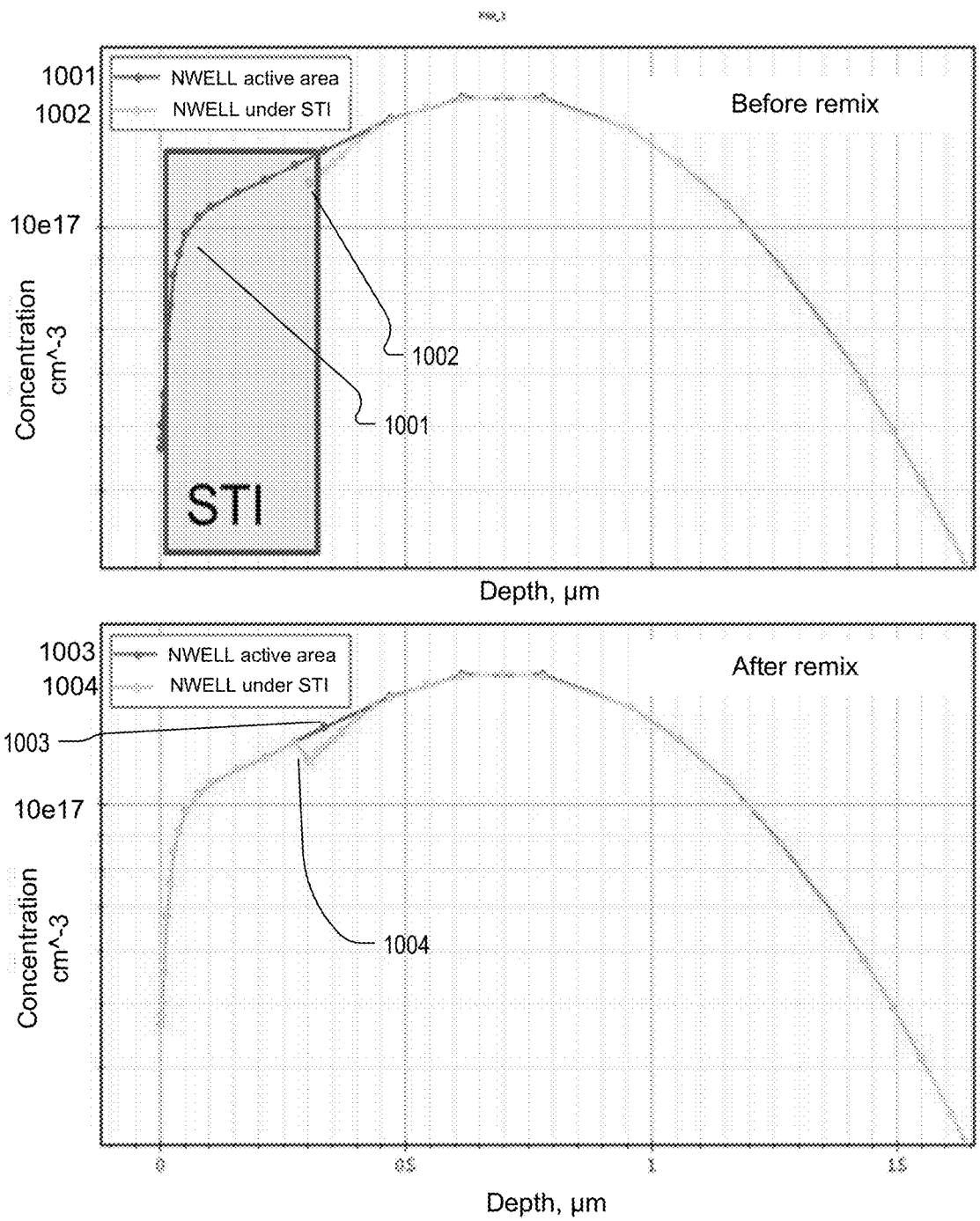
FIG. 10 is a set of graphs showing the effects of remixing diffusion profiles.

FIG. 10 is a set of graphs showing the effects of remixing diffusion profiles.

Figure 11:
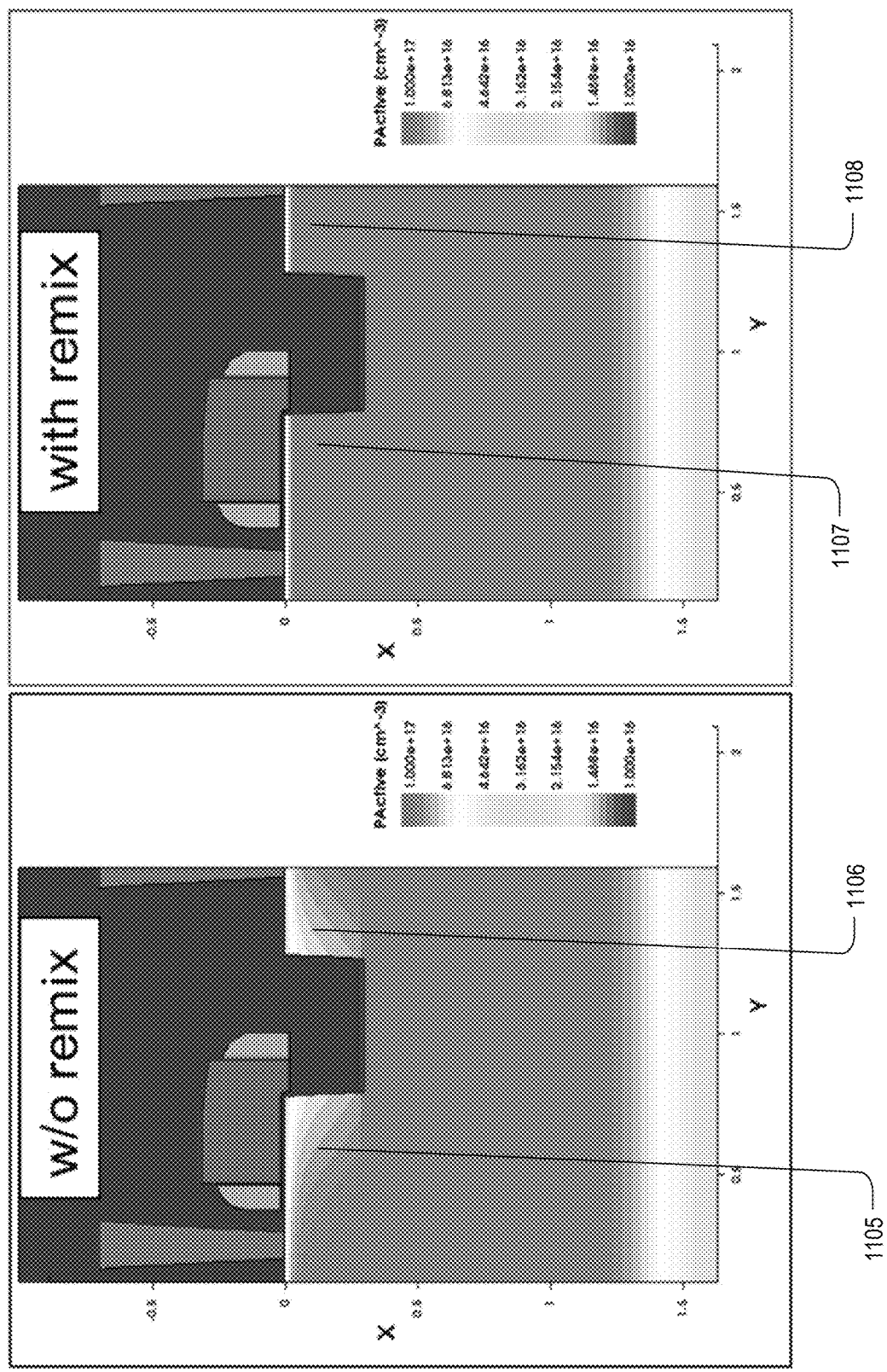
FIG. 11 is a set of concentration graphs showing the effects of remixing diffusion profiles.

FIG. 11 is a set of concentration graphs showing the effects of remixing diffusion profiles, corresponding to FIG. 10.

The remix operation addresses the doping artifacts appearing in the transition region between active area and isolation area.

The example shows a gate with spacers overlapping an STI (shallow trench isolation oxide). In FIG. 10, profile 1002 before remix ends at the bottom of the STI to indicate zero active doping concentration within the STI region (typically oxide) because dopants are inactive in insulators. The active profile 1001 extends until the Si surface. When using these two profiles 1001 and 1002 to merge active area and isolation profiles, artifacts 1105 and 1106 result in FIG. 11, shown as an active dopant concentration abnormally dropping-off nearby the STI edges, from about $10^{17}$ cm$^{-3}$ below the STI to about $5 \times 10^{16}$ cm$^{-3}$ in just under Si on both sides of the STI. By extending the profile 1004 until Si the surface and using this profile for merging active area and isolation profiles 1003 and 1004, this artifact is addressed, as shown in 1107 and 1108 of FIG. 11. The resulting 1D profile is free of the abnormal drop-off of active dopant concentration nearby the STI edges.

Alternatives of generating the 2D lateral profile are discussed as follows.

Figure 12:
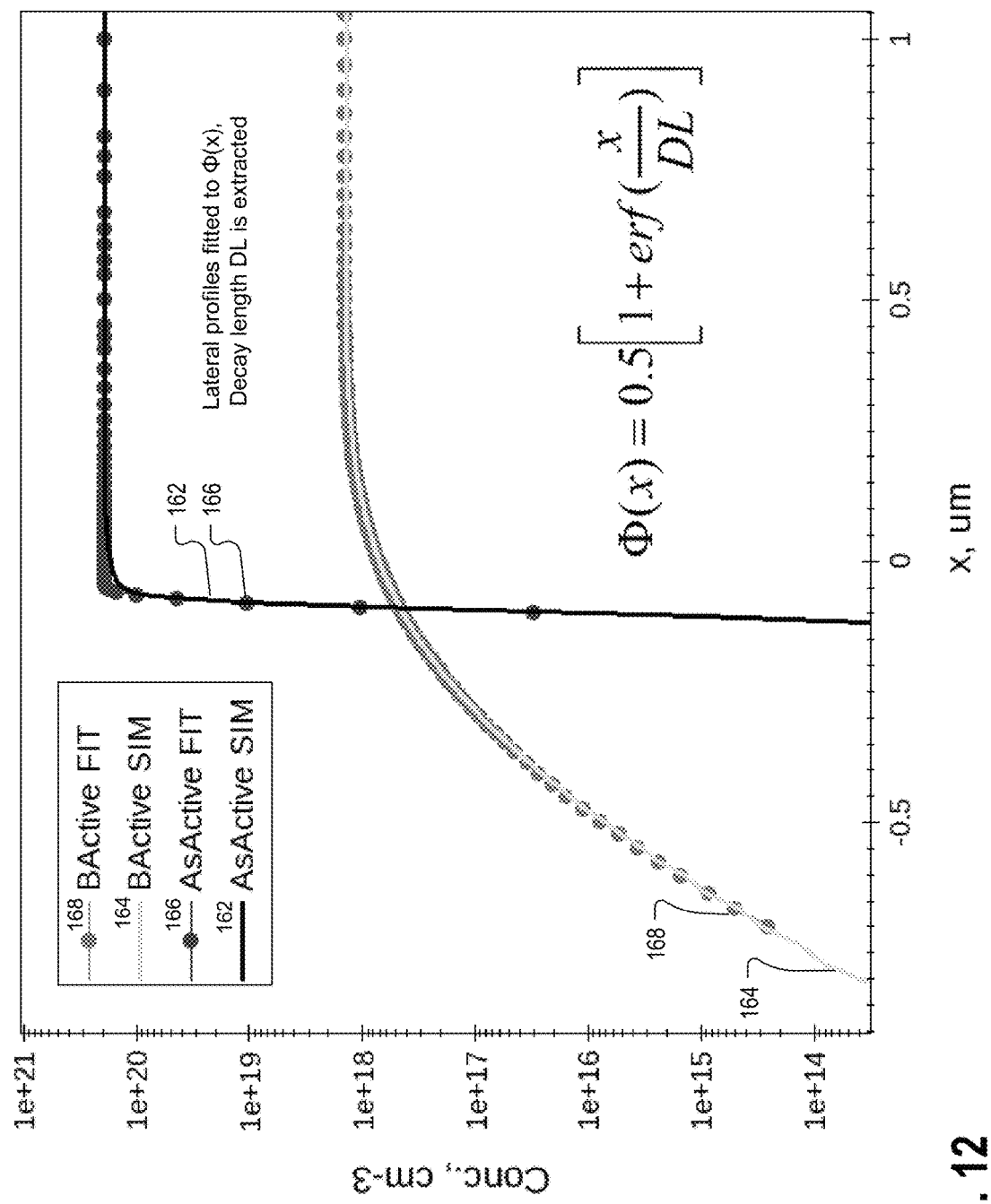
FIG. 12 shows the extraction of a decay length parameter from 1D lateral profiles.

FIG. 12 shows the extraction of a decay length parameter from 1D lateral profiles.

The example shows lateral profiles for different dopants boron and arsenic, with respective spreading parameters, in this case decay lengths in an error function. In FIG. 12, profile 164 is the simulated lateral profile of boron, and 168 is the fitted lateral profile of boron. Profile 162 is the simulated lateral profile of arsenic, and 166 is the fitted lateral profile of arsenic. The following 1D fitted profile is used:

$$\Phi(x) = \frac{1}{2}\left[1 + \mathrm{erf}\left(\frac{x}{DL}\right)\right]$$

Figure 13:
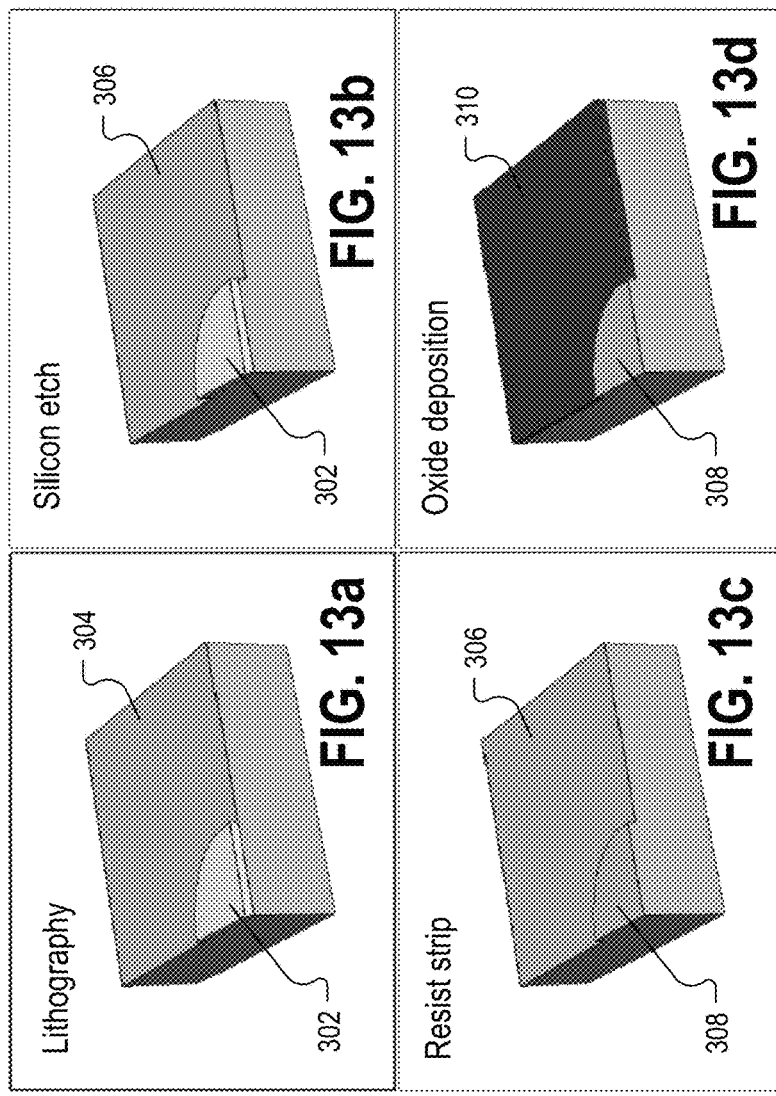
FIGS. 13a-13e show perspective views of part of a lithographic process flow and a flat 2D slice.

FIGS. 13*a*-13*d* show perspective views of part of a lithographic process flow used in several of the following figures. In FIG. 13*a*, photoresist is formed lithographically to cover region 302 but not region 304. In FIG. 13*b*, silicon is etched in region 304 uncovered by the photoresist, resulting in etched region 306. In FIG. 13*c*, the photoresist is stripped, leaving stripped region 308 and etched region 306. In FIG. 13*d*, oxide is deposited in etched region 306 to form an oxide region 310. FIG. 13*e* shows a flat 2D slice of FIG. 13*d*, with stripped region 308 and oxide region 310.

Figure 14:
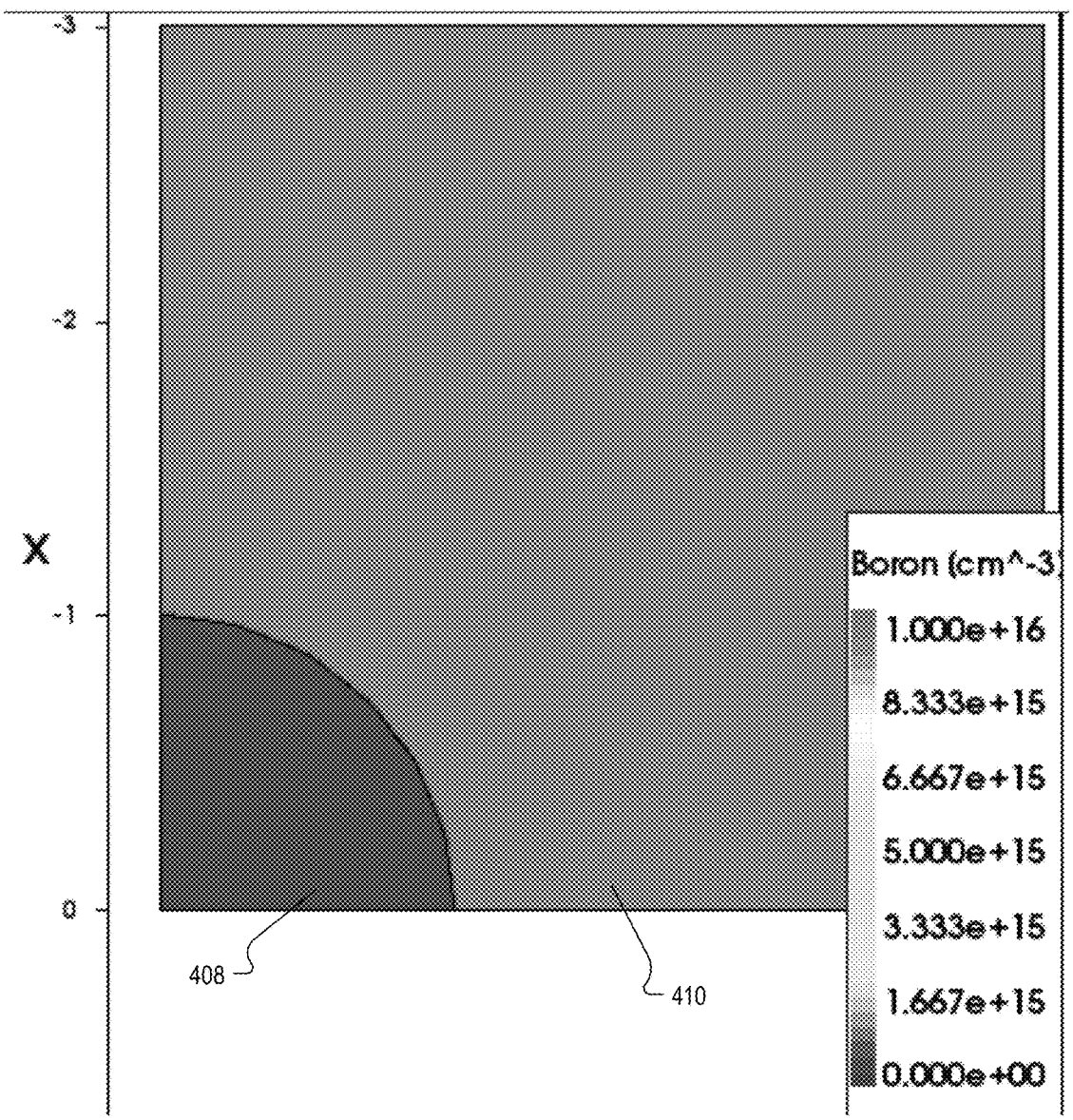
FIG. 14 shows an initial dopant concentration in connection with FIGS. 13a-e.

FIG. 14 shows an initial dopant concentration in connection with the lithographic process of FIGS. 13*a*-*d* and the flat 2D slice in FIG. 13*e*. Before diffusion, the boron concentration is $10^{16}$ cm$^{-3}$ in oxide region 410, and is zero in the silicon 408 of the stripped region.

Figure 16:
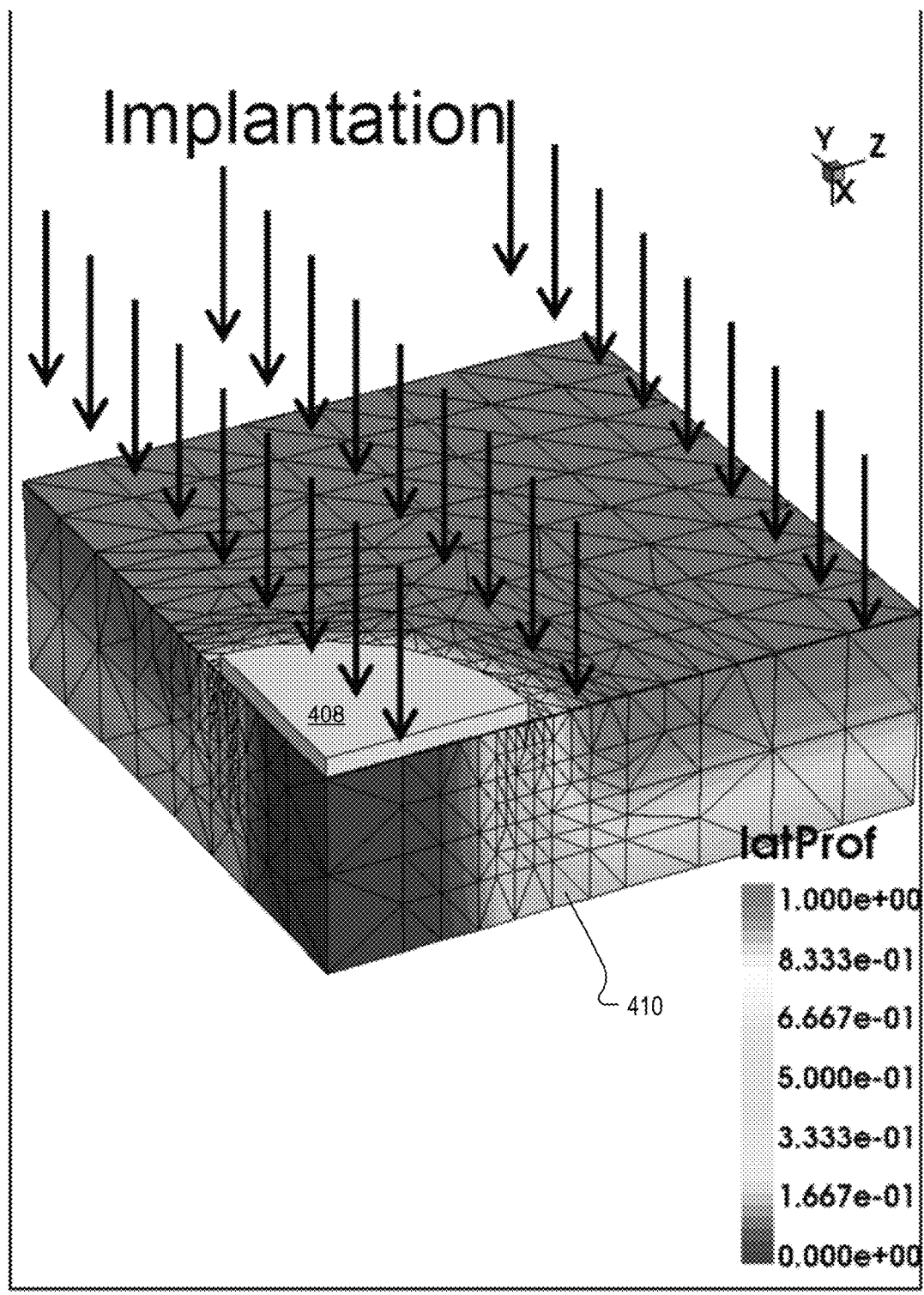
FIG. 16 shows the 3D mesh with implanted dopant concentrations.

FIGS. 15-16 show one embodiment of generating a 2D lateral profile, in which a 3D mesh is generated in order to generate the 2D lateral profile.

FIG. 15*a* shows a sharp mask image, which indicates good results for the convolution technique. Masks generally can be broken down into basic shapes such as FIG. 15*a*. FIG. 15*b* shows a 2D lateral function, in this case a Gaussian function, to represent the movement of dopants, having the following form:

$$G(x, y) = \frac{1}{\sigma\sqrt{2\pi}} e^{\frac{-x^2}{2\sigma^2}}$$

In which the standard deviation, $\sigma$, is the diffusion length DL over the square root of 2.

To generate the 2D lateral profile, the 2D mask or 2D photoresist resulting from the mask is convolved with the 2D lateral function. FIG. 15*c* shows the convolution result of a Gaussian blur.

FIG. 16 shows the 3D mesh with implanted dopant concentrations at various depths of the 3D mesh being determined by the Gaussian blur. The 3D mesh scale is normalized with 1 being the peak concentration.

Figure 18:
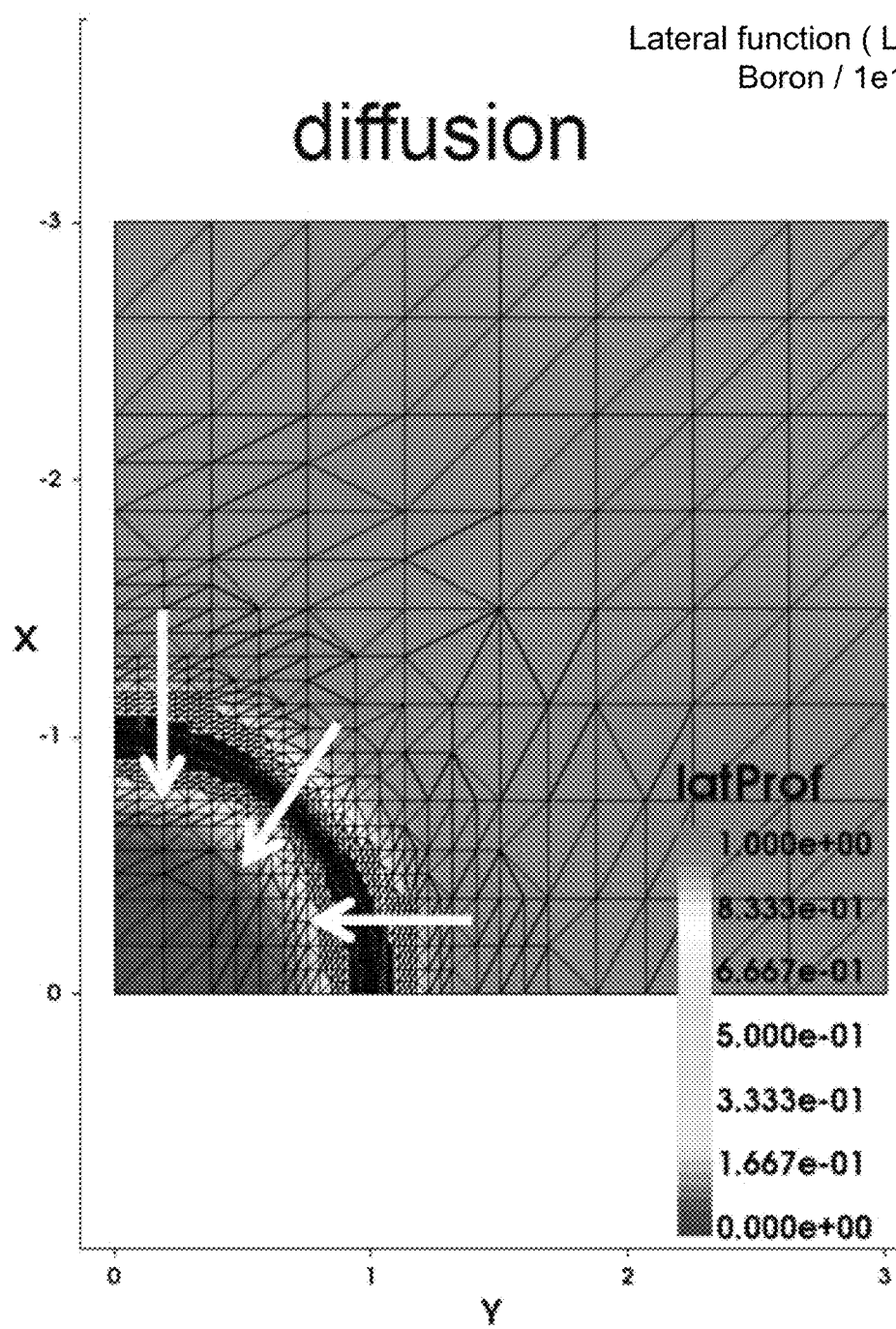
FIG. 18 shows the 2D mesh with implanted dopant concentrations.

FIGS. 17-18 show another embodiment of generating a 2D lateral profile, in which a 2D mesh rather than a 3D mesh can be generated in order to generate the 2D lateral profile.

FIG. 17a shows a sharp mask image, which indicates good results for the diffusion technique. Masks generally can be broken down into basic shapes such as FIG. 17a. FIG. 17b shows a diffusion equation, to represent the movement of dopants, having the following form:

The 1D diffusion formula is as follows:

$$D\frac{\partial^2 C}{\partial x^2} = \frac{\partial C}{\partial t}$$

in which D is the diffusion constant.

To generate the 2D lateral profile, diffusion equation solutions are used. FIG. 15c shows the diffusion equation solution resulting from the initial conditions for diffusion as represented by the sharp mask image of FIG. 17a.

In the example, a diffusion equation for 1 second is solved in the mask plane. The same distribution results as with the analytic implantation alternative of FIGS. 15-16, provided the diffusion coefficient is constant and equals to one quarter of a diffusion length (DL).

The 1D diffusion equation solution is as follows:

$$\Phi(x) = \frac{C_{max}}{2}\left[1 + \mathrm{erf}\left(\frac{x}{2\sqrt{D\tau}}\right)\right]$$

Although 1 second time is chosen for convenience, the product of the diffusion coefficient and diffusion time which equals diffusion length is more determinative of the result.

The 2D diffusion formula is as follows:

$$D\nabla^2 C = \frac{\partial C}{\partial t} \rightarrow$$
$$\frac{\partial^2 C}{\partial x^2} + \frac{\partial^2 C}{\partial y^2} - \frac{1}{D}\frac{\partial C}{\partial t} = 0$$

The 2D diffusion formula presents similar solutions to the 1D diffusion formula but with a cylindrical distribution.

FIG. 18 shows 2D mesh with implanted dopant concentration being determined by a solution to the diffusion equation. The 2D mesh scale is normalized with 1 being the peak concentration.

Both the convolution and diffusion equation methods give identical results but the latter one is preferred because it does not require 3D meshes so it is naturally faster and more robust.

Figure 19:
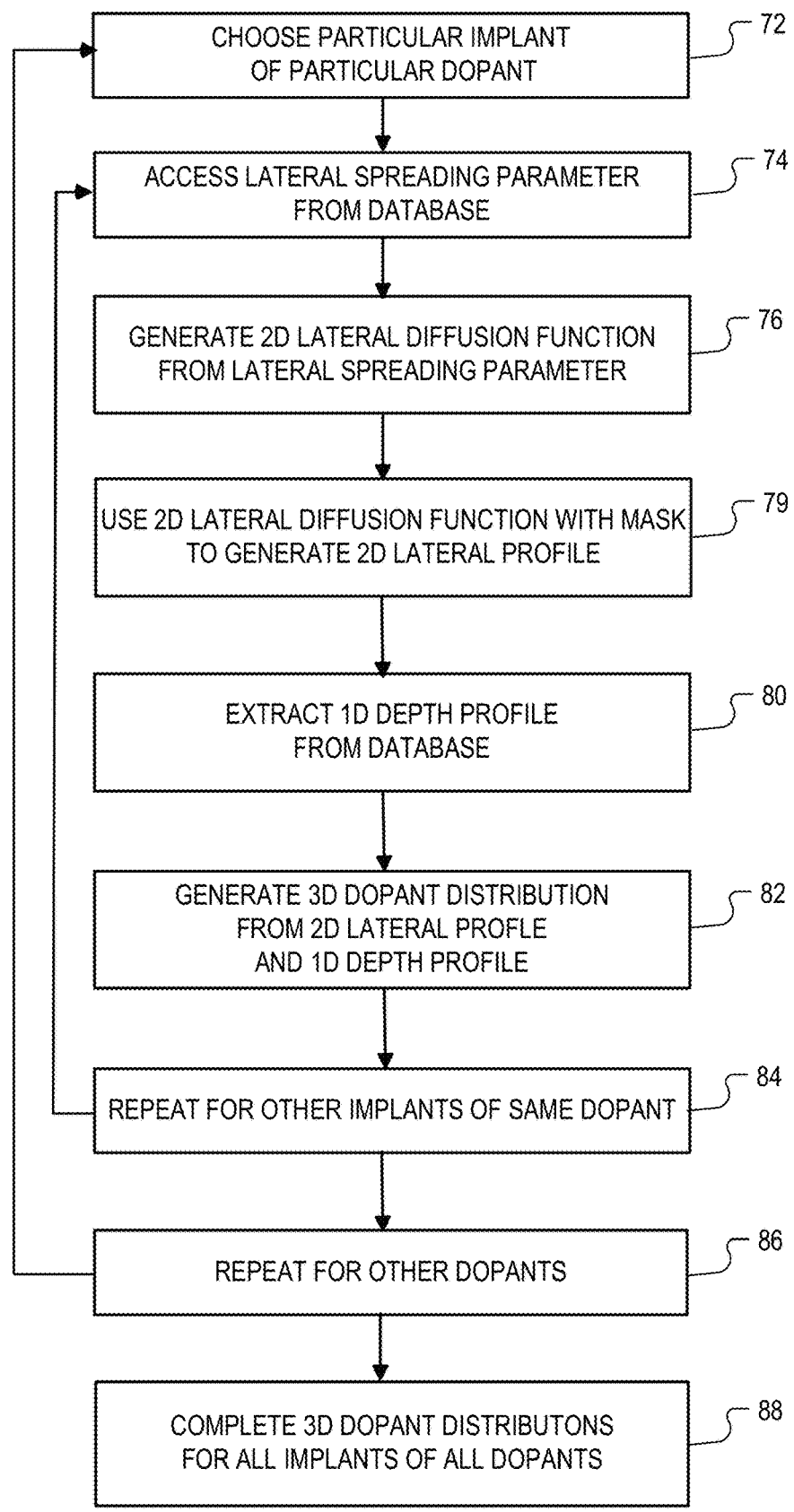
FIG. 19 is a simplified process flow showing more detail on the step of completing 3D dopant distributions, similar to FIG. 6 but based on diffusion rather than convolution.

FIG. 19 is a simplified process flow showing more detail on the step of completing 3D dopant distributions in FIG. 1, similar to FIG. 6 but based on diffusion rather than convolution.

The process flow is similar between FIGS. 6 and 19. However, in 76, the 2D lateral function is based on a solution to the diffusion equation. Instead of convolution, in 79 the 2D lateral profile is generated from the 2D lateral function which can be based on a solution to a diffusion equation, with initial dopant conditions based on the mask of photoresist layer based on the mask for the particular implant of the particular dopant or the mask for the particular oxidation, to generate the 2D lateral profile.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. In addition, and without limitation, any and all variations described, suggested or incorporated by reference in the Background section of this patent application are specifically incorporated by reference into the description herein of embodiments of the invention. In addition, any and all variations described, suggested or incorporated by reference herein with respect to any one embodiment are also to be considered taught with respect to all other embodiments. The embodiments described herein were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. A non-transitory computer readable medium for enabling rapid approximation of three-dimensional dopant distributions resulting in an integrated circuit from processing with additional dopants, the computer readable medium having stored thereon a plurality of instructions, which when executed by a processor, transform a first representation of the integrated circuit undergoing processing into a second representation of the integrated circuit undergoing processing, the second representation of the integrated circuit undergoing processing including the additional dopants relative to the first representation of the integrated circuit undergoing processing, the plurality of instructions including:

instructions that cause the processor to perform process simulation of a first addition of a first dopant under a first set of process conditions to generate a one-dimensional lateral profile of the first dopant and a one-dimensional depth profile of the first dopant, wherein the one-dimensional lateral profile of the first dopant indicates a concentration of the first dopant along a single lateral dimension and the one-dimensional depth profile of the first dopant indicates a concentration of the first dopant solely along a vertical dimension;

instructions that cause the processor to generate a two-dimensional lateral dopant profile from adding the first dopant under the first set of process conditions with a first mask corresponding to the first dopant, by convolving the first mask with a lateral diffusion function in the two dimensions, the lateral diffusion function customized with spreading data from the one-dimensional lateral profile, wherein the two-dimensional lateral dopant profile indicates a concentration of the first dopant in only two dimensions both of which are lateral dimensions; and instructions that cause the processor to combine the two-dimensional lateral dopant profile of the dopant with the one-dimensional depth profile of the dopant so as to thereby generate a three-dimensional dopant distribution from adding the first dopant under the first set of process conditions with the mask.

2. The non-transitory computer readable medium of claim 1, wherein the process simulation is performed with another mask different from the first mask.

3. The non-transitory computer readable medium of claim 1, wherein the three-dimensional dopant distribution represents a quantity of the first dopant.

4. The non-transitory computer readable medium of claim 1, wherein the first set of conditions are end-of-process conditions that incorporate other thermal processes subsequent to the first addition of the first dopant, the other thermal processes associated with at least one of another addition of the first dopant and an addition of another dopant.

5. The non-transitory computer readable medium of claim 1, wherein the spreading data is a parameter generated by fitting the one-dimensional lateral profile to at least an error function erf.

6. The non-transitory computer readable medium of claim 1, wherein the one-dimensional lateral profile is selected from results of the process simulation at a surface depth.

7. The non-transitory computer readable medium of claim 1, wherein the two-dimensional lateral dopant profile differs for field oxidation and hard mask oxidation, and the one-dimensional depth profile differs for field oxidation and hard mask oxidation.

8. The non-transitory computer readable medium of claim 1, wherein the lateral diffusion function is a Gaussian.

9. The non-transitory computer readable medium of claim 1, wherein the spreading data is a standard deviation.

10. The non-transitory computer readable medium of claim 1, wherein the three-dimensional dopant distribution generated with the mask being non-rectangular, has results before a complete 3D simulation.

11. The non-transitory computer readable medium of claim 1, wherein the three-dimensional dopant distribution generated with the mask having an opening dimension of 1-4 microns, has results before a complete 3D simulation.

12. The non-transitory computer readable medium of claim 1, wherein the plurality of instructions further include instructions that cause the processor to perform:
splitting the first mask into a second mask and a third mask, the second mask overlapping with a LOCOS mask, and the third mask not overlapping with the LOCOS mask, and separate convolutions with different lateral diffusion functions are performed with the second mask and the third mask.

13. A system for enabling rapid approximation of three-dimensional dopant distributions resulting in an integrated circuit from processing with additional dopants, comprising:
a memory; and
a data processor coupled to the memory, the data processor configured to transform a first representation of the integrated circuit undergoing processing into a second representation of the integrated circuit undergoing processing, the second representation of the integrated circuit undergoing processing including the additional dopants relative to the first representation of the integrated circuit undergoing processing, the data processor:
performing process simulation of a first addition of a first dopant under a first set of process conditions to generate a one-dimensional lateral profile of the first dopant and a one-dimensional depth profile of the first dopant, wherein the one-dimensional lateral profile of the first dopant indicates a concentration of the first dopant along a single lateral dimension and the one-dimensional depth profile of the first dopant indicates a concentration of the first dopant solely along a vertical dimension;
generating a two-dimensional lateral dopant profile from adding the first dopant under the first set of process conditions with a first mask corresponding to the first dopant, by convolving the first mask with a lateral diffusion function in two dimensions, the lateral diffusion function customized with spreading data from the one-dimensional lateral profile, wherein the two-dimensional lateral dopant profile indicates a concentration of the first dopant in only two dimensions both of which are lateral dimensions; and
combining the two-dimensional lateral dopant profile of the dopant with the one-dimensional depth profile of the dopant so as to thereby generate a three-dimensional dopant distribution from adding the first dopant under the first set of process conditions with the mask.

14. A system for enabling rapid approximation of three-dimensional dopant distributions resulting in an integrated circuit from processing with additional dopants, comprising:
a memory; and
a data processor coupled to the memory, the data processor configured to transform a first representation of the integrated circuit undergoing processing into a second representation of the integrated circuit undergoing processing, the second representation of the integrated circuit undergoing processing including the additional dopants relative to the first representation of the integrated circuit undergoing processing, the data processor:
performing process simulation of a first addition of a first dopant under a first set of process conditions to generate a one-dimensional lateral profile of the first dopant and a one-dimensional depth profile of the first dopant, wherein the one-dimensional lateral profile of the first dopant indicates a concentration of the first dopant along a single lateral dimension and the one-dimensional depth profile of the first dopant indicates a concentration of the first dopant solely along a vertical dimension;
generating a two-dimensional lateral dopant profile from adding the first dopant under the first set of process conditions with a first mask corresponding to the first dopant, using at least a first solution to a diffusion equation, the first solution to the diffusion equation customized with diffusion length data from the one-dimensional lateral profile, wherein the two-dimensional lateral dopant profile indicates a concentration of the first dopant in only two dimensions both of which are lateral dimensions; and
combining the two-dimensional lateral dopant profile of the dopant with the one-dimensional depth profile of the dopant so as to generate a three-dimensional dopant distribution from adding the first dopant under the first set of process conditions with the mask.

15. A non-transitory computer readable medium for enabling rapid approximation of three-dimensional dopant distributions resulting in an integrated circuit from processing with additional dopants, the computer readable medium having stored thereon a plurality of instructions, which when executed by a processor, transform a first representation of the integrated circuit undergoing processing into a second representation of the integrated circuit undergoing processing, the second representation of the integrated circuit undergoing processing including the additional dopants relative to the first representation of the integrated circuit undergoing processing, the plurality of instructions comprising instructions that cause the processor to:

perform process simulation of a first addition of a first dopant under a first set of process conditions to generate a one-dimensional lateral profile of the first dopant and a one-dimensional depth profile of the first dopant, wherein the one-dimensional lateral profile of the first dopant indicates a concentration of the first dopant along a single lateral dimension and the one-dimensional depth profile of the first dopant indicates a concentration of the first dopant solely along a vertical dimension;

generate a two-dimensional lateral dopant profile from adding the first dopant under the first set of process conditions with a first mask corresponding to the first dopant, using at least a diffusion equation, the diffusion equation customized with diffusion length data from the one-dimensional lateral profile, wherein the two-dimensional lateral dopant profile indicates a concentration of the first dopant in only two dimensions both of which are lateral dimensions; and combine the two-dimensional lateral dopant profile of the dopant with the one-dimensional depth profile of the dopant so as to generate a three-dimensional dopant distribution from adding the first dopant under the first set of process conditions with the mask.

16. A non-transitory computer readable medium for enabling rapid approximation of three-dimensional dopant distributions resulting in an integrated circuit undergoing processing with additional dopants, the computer readable medium having stored thereon a plurality of instructions, which when executed by a processor, transform a first representation of the integrated circuit undergoing processing into a second representation of the integrated circuit undergoing processing, the second representation of the integrated circuit undergoing processing including the additional dopants relative to the first representation of the integrated circuit undergoing processing, the plurality of instructions comprising instructions that cause the processor to:

access a one-dimensional lateral profile of a first dopant and a one-dimensional depth profile of the first dopant, the one-dimensional lateral profile representative of a first addition of the first dopant under a first set of process conditions, wherein the one-dimensional lateral profile of the first dopant indicates a concentration of the first dopant along a single lateral dimension and the one-dimensional depth profile of the first dopant indicates a concentration of the first dopant solely along a vertical dimension;

access a two-dimensional lateral dopant profile of the first dopant, the two-dimensional lateral dopant profile indicating a concentration of the first dopant in only two dimensions both of which are lateral dimensions and being representative of adding the first dopant under the first set of process conditions with a first mask corresponding to the first dopant, wherein two-dimensional lateral dopant profile is a result of convolving the first mask with a lateral diffusion function in two dimensions, the lateral diffusion function customized with spreading data from the one-dimensional lateral profile; and combine the two-dimensional lateral dopant profile of the dopant with the one-dimensional depth profile of the dopant so as to generate a three-dimensional dopant distribution from adding the first dopant under the first set of process conditions with the mask.

17. A system for enabling rapid approximation of three-dimensional dopant distributions resulting in an integrated circuit from processing with additional dopants, comprising:

a memory; and a data processor coupled to the memory, the data processor configured to transform a first representation of the integrated circuit undergoing processing into a second representation of the integrated circuit undergoing processing, the second representation of the integrated circuit undergoing processing including the additional dopants relative to the first representation of the integrated circuit undergoing processing, the data processor:

accessing a one-dimensional lateral profile of a first dopant and a one-dimensional depth profile of the first dopant, the one-dimensional lateral profile representative of a first addition of the first dopant under a first set of process conditions, wherein the one-dimensional lateral profile of the first dopant indicates a concentration of the first dopant along a single lateral dimension and the one-dimensional depth profile of the first dopant indicates a concentration of the first dopant solely along a vertical dimension;

accessing a two-dimensional lateral dopant profile of the first dopant, the two-dimensional lateral dopant profile indicating a concentration of the first dopant in only two dimensions both of which are lateral dimensions and being representative of adding the first dopant under the first set of process conditions with a first mask corresponding to the first dopant, wherein two-dimensional lateral dopant profile is a result of using at least a first solution to a diffusion equation, the first solution to the diffusion equation customized with diffusion length data from the one-dimensional lateral profile; and combining the two-dimensional lateral dopant profile of the dopant with the one-dimensional depth profile of the dopant so as to generate a three-dimensional dopant distribution from adding the first dopant under the first set of process conditions with the mask.

18. A computer system for enabling rapid approximation of three-dimensional dopant distributions resulting in an integrated circuit from processing with additional dopants, by transforming a first representation of the integrated circuit undergoing processing into a second representation of the integrated circuit undergoing processing, the second representation of the integrated circuit undergoing processing including the additional dopants relative to the first representation of the integrated circuit undergoing processing, comprising:

a data processor; and memory coupled to the data processor, the memory including software code portions which, together with the memory and data processor, comprise:

means for simulating a first addition of a first dopant under a first set of process conditions to generate a one-dimensional lateral profile of the first dopant and a one-dimensional depth profile of the first dopant, wherein the one-dimensional lateral profile of the first dopant indicates a concentration of the first dopant along a single lateral dimension and the one-dimensional depth profile of the first dopant indicates a concentration of the first dopant solely along a vertical dimension;

means for generating a two-dimensional lateral dopant profile from adding the first dopant under the first set of process conditions with a first mask corresponding to the first dopant, by convolving the first mask with a lateral diffusion function in the two dimensions, the lateral diffusion function customized with spreading data from the one-dimensional lateral profile, wherein the two-dimensional lateral dopant profile indicates a concentration of the first dopant in only two dimensions both of which are lateral dimensions; and means for combining the two-dimensional lateral dopant profile of the dopant with the one-dimensional depth profile of the dopant so as to thereby generate a three-dimensional dopant distribution from adding the first dopant under the first set of process conditions with the mask.

19. A non-transitory computer readable medium for enabling rapid modeling of integrated circuits by approximating a plurality of three-dimensional dopant distributions resulting in an integrated circuit from processing with additional dopants, the computer readable medium having stored thereon a plurality of instructions, which when executed by a processor, transform a first representation of the integrated circuit undergoing processing into a plurality of second representations of the integrated circuit undergoing processing, the second representations of the integrated circuit undergoing processing including the additional dopants relative to the first representation of the integrated circuit undergoing processing, the plurality of instructions including:

(A) instructions that, for each of a plurality of preliminary combinations of a dopant and a set of process conditions, cause the processor to simulate addition of the dopant of the preliminary combination under the set of process conditions of the preliminary combination, to generate a one-dimensional lateral profile of the dopant and a one-dimensional depth profile of the dopant, wherein the one-dimensional lateral profile of the dopant indicates a concentration of the dopant along a single lateral dimension and the one-dimensional depth profile of the dopant indicates a concentration of the dopant solely along a vertical dimension;

(B) instructions that, for each of the preliminary combinations, store in a database in association with the dopant of the preliminary combination and the set of process conditions of the preliminary combination both the one-dimensional depth profile of the preliminary combination, and a lateral spreading parameter generated in dependence upon the one-dimensional lateral profile of the preliminary combination;

(C) instructions that, for each of a plurality of operational combinations of a dopant and a set of process conditions:

(1) cause the processor to determine in dependence upon the database a one-dimensional depth profile for the operational combination and a spreading parameter generated in dependence upon the one-dimensional lateral profile for the operational combination;

(2) cause the processor to generate a two-dimensional lateral dopant profile for the operational combination from adding the dopant of the operational combination under the set of process conditions of the operational combination with a first mask corresponding to the dopant of the operational combination, by convolving the first mask with a lateral diffusion function in the two dimensions, the lateral diffusion function customized with the spreading parameter generated in dependence upon the one-dimensional lateral profile determined for the operational combination, wherein the two-dimensional lateral dopant profile for the operational combination indicates a concentration of the dopant for the operational combination in only two dimensions both of which are lateral dimensions; and (3) cause the processor to combine the two-dimensional lateral dopant profile generated for the operational combination with the one-dimensional depth profile determined for the operational combination, so as to thereby generate a three-dimensional dopant distribution for the operational combination from adding the dopant for the operational combination under the set of process conditions for the operational combination with the mask.

20. A computer-implemented method for enabling rapid modeling of integrated circuits by approximating three-dimensional dopant distributions resulting in an integrated circuit from processing with a first dopant under a first set of process conditions, by transforming a first representation of the integrated circuit undergoing processing into a second representation of the integrated circuit undergoing processing, the second representation of the integrated circuit undergoing processing including the first dopant relative to the first representation of the integrated circuit undergoing processing, comprising:

a computer system generating a registry of lateral spreading parameters and one-dimensional depth profiles for a plurality of preliminary combinations of a dopant and a set of process conditions, wherein the lateral spreading parameter in the registry for a particular combination in the plurality of combinations indicates a concentration of the dopant of the particular combination along a single lateral dimension for the set of process conditions of the particular combination and the one-dimensional depth profile of the particular combination indicates a concentration of the dopant of the particular combination solely along a vertical dimension for the set of process conditions of the particular combination;

a computer system determining from the registry a first lateral spreading parameter and a first one-dimensional depth profile for the first dopant and the first set of conditions;

a computer system generating a two-dimensional lateral dopant profile from adding the first dopant under the first set of process conditions with a first mask corresponding to the first dopant, by convolving the first mask with a lateral diffusion function in two dimensions, the lateral diffusion function customized with the first lateral spreading parameter, wherein the two-dimensional lateral dopant profile indicates a concentration of the first dopant in only two dimensions both of which are lateral dimensions; and a computer system generating a three-dimensional dopant distribution from adding the first dopant under the first set of process conditions with the first mask by combining the two-dimensional lateral dopant profile with the first one-dimensional depth profile of the first dopant.

21. The system of claim 13, wherein the process simulation is performed with another mask different from the first mask.

22. The system of claim 13, wherein the first set of process conditions are end-of-process conditions that incorporate other thermal processes subsequent to the first addition of the first dopant, the other thermal processes associated with at least one of another addition of the first dopant and an addition of another dopant.

23. The system of claim 13, wherein the spreading data is a parameter generated by fitting the one-dimensional lateral profile to at least an error function erf.

24. The system of claim 13, wherein the one-dimensional lateral profile is selected from results of the process simulation at a surface depth.

25. The system of claim 13, wherein the data processor further:
splits the first mask into a second mask and a third mask, the second mask overlapping with a LOCOS mask, and the third mask not overlapping with the LOCOS mask, and separate convolutions with different lateral diffusion functions are performed with the second mask and the third mask.

26. The system of claim 14, wherein the one-dimensional lateral profile is selected from results of the process simulation at a surface depth.

27. The non-transitory computer readable medium of claim 15, wherein the process simulation is performed with another mask different from the first mask.

28. The non-transitory computer readable medium of claim 15, wherein the first set of process conditions are end-of-process conditions that incorporate other thermal processes subsequent to the first addition of the first dopant, the other thermal processes associated with at least one of another addition of the first dopant and an addition of another dopant.

29. The non-transitory computer readable medium of claim 15, wherein the one-dimensional lateral profile is selected from results of the process simulation at a surface depth.

30. The non-transitory computer readable medium of claim 16, wherein the spreading data is a parameter generated by fitting the one-dimensional lateral profile to at least an error function erf.

31. The system of claim 17, wherein the first set of process conditions are end-of-process conditions that incorporate other thermal processes subsequent to the first addition of the first dopant, the other thermal processes associated with at least one of another addition of the first dopant and an addition of another dopant.

32. The system of claim 18, wherein the spreading data is a parameter generated by fitting the one-dimensional lateral profile to at least an error function erf.

33. The method of claim 20, wherein the first set of process conditions are end-of-process conditions that incorporate other thermal processes subsequent to the first addition of the first dopant, the other thermal processes associated with at least one of another addition of the first dopant and an addition of another dopant.

34. The method of claim 20, wherein the one-dimensional lateral profile is selected from results of the process simulation at a surface depth.

35. The method of claim 20, further comprising:
splitting the first mask into a second mask and a third mask, the second mask overlapping with a LOCOS mask, and the third mask not overlapping with the LOCOS mask, and separate convolutions with different lateral diffusion functions are performed with the second mask and the third mask.

* * * * *